United States Patent
Hatakeyama et al.

(10) Patent No.: US 7,214,743 B2
(45) Date of Patent: May 8, 2007

(54) RESIST LOWER LAYER FILM MATERIAL AND METHOD FOR FORMING A PATTERN

(75) Inventors: Jun Hatakeyama, Niigata (JP); Hideto Kato, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 302 days.

(21) Appl. No.: 10/862,633

(22) Filed: Jun. 8, 2004

(65) Prior Publication Data
US 2004/0259037 A1    Dec. 23, 2004

(30) Foreign Application Priority Data
Jun. 18, 2003   (JP)   ............................. 2003-174020

(51) Int. Cl.
C08F 283/00    (2006.01)
G03F 7/84      (2006.01)
G03F 7/09      (2006.01)
G03F 7/038     (2006.01)

(52) U.S. Cl. .................. 525/534; 430/316; 430/313; 430/270.1

(58) Field of Classification Search ................ 525/534; 430/316, 313, 270.1
See application file for complete search history.

(56) References Cited

U.S. PATENT DOCUMENTS

| | | |
|---|---|---|
| 5,294,680 A | 3/1994 | Knors et al. |
| 5,525,457 A | 6/1996 | Nemoto et al. |
| 5,756,255 A | 5/1998 | Sato et al. |

(Continued)

FOREIGN PATENT DOCUMENTS

JP    A 6-118651    4/1994

(Continued)

OTHER PUBLICATIONS

Brunsvold et al., "Evaluation of a Deep UV Bilayer Resist for Sub-Half Micron Lithography," SPIE, vol. 1925, pp. 377-387, 1993.

(Continued)

*Primary Examiner*—Duc Truong
(74) *Attorney, Agent, or Firm*—Oliff & Berridge PLC

(57) ABSTRACT

There is disclosed a resist lower layer film material for a multilayer-resist film used in lithography which contains a polymer having at least a repeating unit represented by the following general formula (1). There can be provided a resist lower layer film material for a multilayer-resist process, especially for a two-layer resist process, which functions as an excellent antireflection film especially for exposure with a short wavelength, namely has higher transparency, and has the optimal n value and k value, and is excellent in an etching resistance in substrate processing, and a method for forming a pattern on a substrate by lithography using it (1)

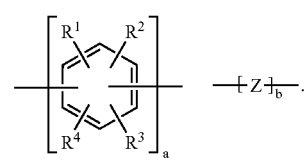

10 Claims, 4 Drawing Sheets

U.S. PATENT DOCUMENTS

| | | | |
|---|---|---|---|
| 5,851,730 | A | 12/1998 | Thackeray et al. |
| 5,851,738 | A | 12/1998 | Thackeray et al. |
| 5,886,119 | A | 3/1999 | Schaedeli et al. |
| 5,908,738 | A | 6/1999 | Sato et al. |
| 5,972,560 | A | 10/1999 | Kaneko et al. |
| 6,013,407 | A | 1/2000 | Kawata et al. |
| 6,028,154 | A | 2/2000 | Schaedeli et al. |
| 6,042,989 | A | 3/2000 | Schaedeli et al. |
| 6,309,796 | B1 | 10/2001 | Nakashima et al. |
| 6,316,165 | B1 | 11/2001 | Pavelchek et al. |
| 6,451,503 | B1 | 9/2002 | Thackeray et al. |
| 6,528,235 | B2 | 3/2003 | Thackeray et al. |
| 6,623,909 | B2 | 9/2003 | Hatakeyama et al. |
| 2002/0086934 | A1 | 7/2002 | Kawaguchi et al. |
| 2002/0187408 | A1 | 12/2002 | Thackeray et al. |

FOREIGN PATENT DOCUMENTS

| | | |
|---|---|---|
| JP | A 6-202317 | 7/1994 |
| JP | A 7-69611 | 7/1995 |
| JP | A 8-179502 | 7/1996 |
| JP | A 8-179509 | 7/1996 |
| JP | A 8-220750 | 8/1996 |
| JP | A 10-69072 | 3/1998 |
| JP | A 10-282666 | 10/1998 |
| JP | A 2001-40293 | 2/2001 |
| JP | A 2002-14474 | 1/2002 |

OTHER PUBLICATIONS

Hatakeyama et al., "Investigation of Discrimination Enhancement in Polysilsesquioxane Based Positive Resist for ArF Lithography," SPIE, vol. 3333, pp. 62-72, 1998.

Schaedeli et al., "Evaluation of Materials for 193-nm Lithography," Journal of Photopolymer Science and Technology, vol. 9, No. 3, pp. 435-446, 1996.

Kwong et al., "IBM 193nm Bilayer Resist: Materials, Lithographic Performance and Optimization," Advances in Resist Technology and Processing XVIII, Proceedings of SPIE, vol. 4345, pp. 50-57, 2001.

Lynch et al., "Properties and Performance of Near UV Reflectivity Control Layers," SPIE, vol. 2195, pp. 225-229, 1994.

F I G. 2
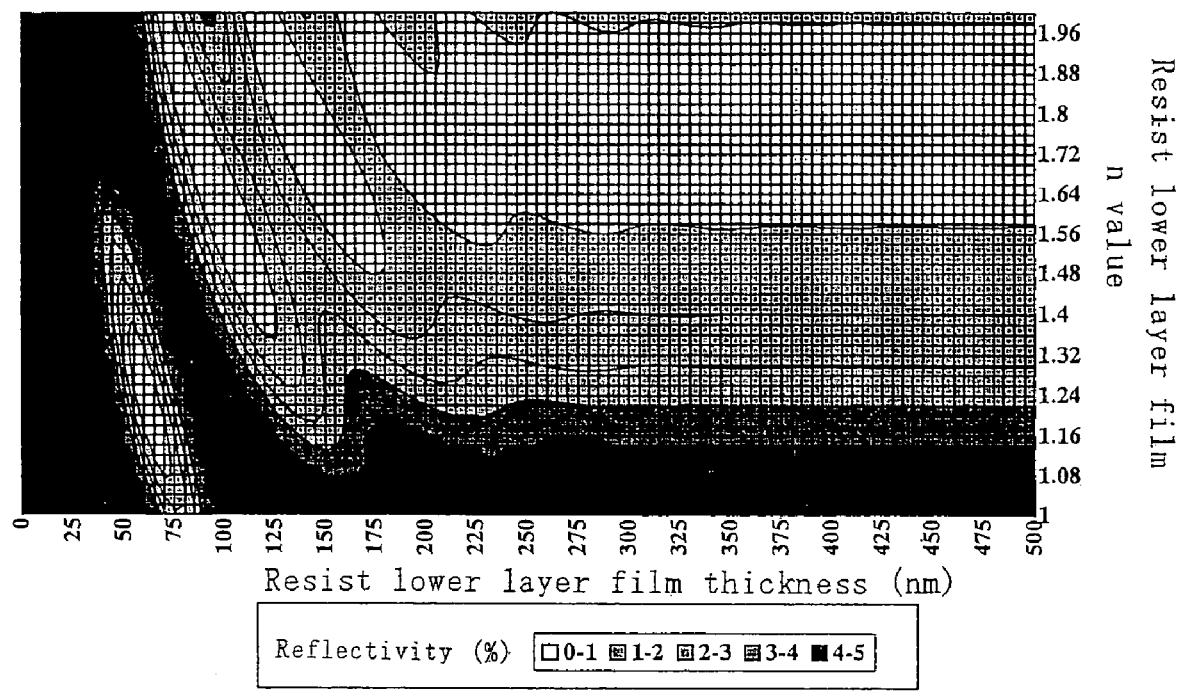

(a)

(b)

(c)

(d)

RESIST LOWER LAYER FILM MATERIAL AND METHOD FOR FORMING A PATTERN

BACKGROUND OF THE INVENTION

1. Field of the Invention

The present invention relates to a resist lower layer film material of a multilayer-resist film used in lithography, and especially to a resist lower layer film material of a multilayer-resist film suitable for exposure with far ultraviolet rays, ArF excimer laser light (193 nm), $F_2$ laser light (157 nm), $Kr_2$ laser light (146 nm), $Ar_2$ laser light (126 nm), or the like. Furthermore, the present invention also relates to a method for forming a pattern on a substrate by lithography using it.

2. Description of the Related Art

With a tendency of high integration and high-speed of LSI, a finer pattern rule is needed in recent years, and in lithography using optical exposure which is used as a general technique at a present, an essential resolution derived from a wavelength of a light source has almost reach the limit.

There has been used widely optical exposure using g line (436 nm) or i line (365 nm) of a mercury-vapor lamp as a light source for lithography when a resist pattern is formed. It has been considered that a method of using an exposure light with a shorter wavelength is effective as a means for a further finer pattern. For this reason, for example, KrF excimer laser (248 nm) with a short wavelength has been used as an exposure light source instead of i line (365 nm), for mass-production process of a 64 M bit DRAM processing method. However, a light source with far shorter wavelength is needed for manufacture of DRAM with a degree-of-integration of 1 G or more which needs a still finer processing technique (for example, a processing dimension is 0.13 μm or less), and lithography using ArF excimer laser (193 nm) has been especially examined.

On the other hand, it has been known conventionally that a multilayer-resist process such as a two-layer resist process is excellent in order to form a pattern with a high aspect ratio on a board which has a difference in level. Especially, it is supposed that it is preferable to use a high-molecular silicone compound having a hydrophilic group, such as a hydroxy group, a carboxyl group and the like, as a resist upper layer film, in order to develop a two-layer resist film with a general alkali developer in a two-layer resist process.

As such a high-molecular silicone compound, there have been proposed for KrF excimer lasers a silicone chemically amplified positive-resist material wherein polyhydroxy benzyl silsesquioxane, which is a stable alkali soluble silicone polymer, in which some phenolic hydroxyl groups are protected by a t-Boc group is used as a base resin, and it is combined with an acid generating agent (for example, see Japanese Patent Application Laid-open (KOKAI) No. 6-118651 and SPIE vol. 1925 (1993) p 377). Moreover, there have been proposed for ArF excimer lasers a positive resist wherein silsesquioxane of which a cyclohexyl carboxylic acid is substituted with an acid unstable group is used as a base (for example, see Japanese Patent Application Laid-open (KOKAI) No. 10-324748, Japanese Patent Application Laid-open (KOKAI) No. 11-302382, and SPIE vol. 3333 (1998) p 62). Furthermore, there has been proposed for $F_2$ laser a positive resist wherein silsesquioxane having a hexafluoro isopropanol as a soluble group is used as a base (for example, see Japanese Patent Application Laid-open (KOKAI) No. 2002-55456). These high-molecular silicone compounds contain poly silsesquioxane containing a ladder frame by the condensation polymerization of a trialkoxy silane or a tri halogenated silane in a backbone chain.

As a base polymer for resist wherein silicon is suspended from a side chain, (meta)acrylic ester polymer containing silicon has been proposed (for example, see Japanese Patent Application Laid-open (KOKAI) No. 9-110938 and J. Photopolymer Sci. and Technol. Vol. 9 No. 3(1996) p 435–446).

Examples of a resist lower layer film used for a multilayer-resist process, such as a two-layer resist process may include a hydrocarbon compound which can be etched with oxygen gas and the like. It is desirable to have a high etching resistance, since it is used as a mask in the case of etching a substrate under it further. When etching of the resist lower layer film using as a mask the resist upper layer film is conducted according to oxygen gas etching, it is preferable that the resist lower layer film consists of only hydrocarbons which do not contain a silicon atom. Moreover, in order to improve a line width controllability of the resist upper layer film containing a silicon atom and to reduce irregularity on a pattern side wall due to a stationary wave and collapse of a pattern, it is preferable that the resist lower layer film also has a function as an antireflection film. Specifically, it is desirable that a reflectivity from the lower layer film to the resist upper layer film can be kept at 1% or less.

The anti-reflection film as a ground for a monolayer resist process can reduce reflectivity from the substrate to 1% or less by being formed of the material having an optimal refractive index (n value) and an optimal extinction coefficient (k value) with a suitable thickness, even when the substrate under it is a highly reflective board such as polysilicon, aluminum or the like, and thereby quite high anti-reflection effect can be achieved.

FIG. 1 is a graph which shows a relation between a thickness of an anti-reflection film as a ground for a monolayer resist process and a reflectivity thereof at a wavelength of 193 nm. FIG. 1 shows that, for example, in the case that a refractive index of a photoresist film is 1.7 at a wavelength of 193 nm, if the refractive index of the anti-reflection film under it (a real number part of a refractive index) n is 1.5, an extinction coefficient (a imaginary number part of a refractive index) k is 0.5, and a thickness is 42 nm, a reflectivity will become 0.5% or less.

However, in the case that there is a level difference in a ground substrate, a thickness of an anti-reflection film is sharply changed at the level difference. Although the reflection preventive effect in the first base with a thickness of 40–45 nm where the interference effect is strong is high, a reflectivity is sharply changed due to variation of a thickness, since the reflection preventive effect of the anti-reflection film uses not only an absorption of light but the interference effect due to setting an optimal thickness, as shown in FIG. 1.

Then, there has been proposed the material wherein a thickness variation on a level difference is suppressed by increasing a molecular weight of a base resin used for the anti-reflection film material, and thereby a conformal property is improved (for example, see Japanese Patent Application Laid-open (KOKAI) No. 10-69072) However, if the molecular weight of the base resin becomes high in this case, there may be caused a problem that a pinhole is easily generated after spin coating, a problem that it becomes impossible to be filtered, and further a problem that viscosity change will be caused with time and a thickness will be varied, and a problem that a crystal is deposited at a tip of a nozzle. Moreover, a conformal property can be achieved only where a level difference is comparatively low.

Then, there can be considered a method of adopting a thickness more than that of the 3rd base line (170 nm or more) where variation of a reflectivity due to variation of a thickness is comparatively small from FIG. 1. In this case, if k value is between 0.2–0.3, and a thickness is 170 nm or more, the variation of a reflectivity due to variation of a thickness will be small, and a reflectivity can be suppressed to 1.5% or less. However, taking an etching load of the resist film on it into consideration, there is a limitation in making an antireflection film thick, and a thickness of the 2nd base of only 100 nm or less at most is possible.

Moreover, in the case that the ground of the anti-reflection film is a transparent film, such as an oxide film, a nitride film or the like, and there is a level difference under the transparent film, even though the surface of the transparent film was made flat by CMP (Chemical Mechanical Polishing) or the like, a thickness of the transparent film is varied. In this case, although it is possible to make a thickness of the anti-reflection film on it constant, a thickness of the film wherein a reflectivity is minimum will shift by the thickness of the transparent film, when the thickness of the transparent film under the anti-reflection film is varied. Even if a thickness of the anti-reflection film is set so that a reflectivity in the case that the ground is a reflective film may be a minimum value, a reflectivity gets high due to variation of a thickness of a transparent film in some cases.

The material of the anti-reflection film as described above can be roughly classified into an inorganic material and an organic material.

Example of the inorganic material may be a SiON film. Since it is formed by CVD (Chemical Vapor Deposition) with a mixed gas of silane and ammonia and an etching selectivity to a photoresist film is large, it has an advantage that an etching load to the resist film is small. However, since it is hardly exfoliated, application thereof is limited. Moreover, since it contains a nitrogen atom and is a basic substrate, there is also a disadvantage that the footing is likely caused in the case of a positive resist, and an undercut profile is easily caused in the case of a negative resist.

The organic material is advantageous, since it can be formed by a spin coating, it does not need special equipments, as in CVD, sputtering or the like, it can be stripped together with the resist film, footing profile or the like is not generated, the shape is simple, and it has an excellent adhesion property with the resist film. Accordingly, a lot of anti-reflection film materials based on organic materials were proposed. For example, there were proposed those consisting of a condensation product of a diphenylamine derivative and a formaldehyde denaturated melamine resin, an alkali soluble resin and a light absorber (for example, see Japanese Patent Publication No. 7-69611), a reaction product of a maleic anhydride copolymer and diamine type light absorber (for example, see U.S. Pat. No. 5,294,680 specification), those containing a resin binder and a methylol melamic heat crosslinking agent (for example, see Japanese Patent Application Laid-open (KOKAI) No. 6-118631), an acrylate resin base type which has a carboxylic acid group, an epoxy group, and a light-absorption group in the same molecule (for example, see Japanese Patent Application Laid-open (KOKAI) No. 6-118656), those consisting of methylol melamine and a benzophenone light absorber (for example, see Japanese Patent Application Laid-open (KOKAI) No. 8-87115), those wherein a low molecule light absorber is added to a polyvinyl alcohol resin (for example, see Japanese Patent Application Laid-open (KOKAI) No. 8-179509), and the like. All of the anti-reflection film materials using these organic materials as a base are produced by a method of adding a light absorber into a binder polymer, or introducing a light-absorption group into a polymer as a substituent. However, since many of the light absorbers have an aromatic group or a double bond, dry etch resistance is raised by addition of the light absorber, and thus there is a disadvantages that a dry etching selectivity to the resist film is not so high. Since a pattern tends to be finer, a photoresist film tends to be thin, and furthermore, an acrylic or an alicyclic polymer will be used as a photoresist film material in ArF lithography of the next generation, etching resistance of the photoresist film tends to be lowered. Furthermore, there is also a problem that a thickness of the anti-reflection film needs to be increased, as explained above. For these reasons, etching is becoming a serious problem, and thus the anti-reflection film with high etching selectivity to the resist film, namely the anti-reflection film wherein an etch rate is high has been desired.

On the other hand, the function demanded as an antireflection film for the resist lower layer film for a multilayer-resist process such as a two-layer resist process is different from those for the antireflection film of a monolayer resist process. Since the resist lower layer film for the two-layer resist process serves as a mask when etching a substrate, it needs to have a high etching resistance under the condition of etching of the substrate. Thus, a high etch rate is required for an antireflection film in a monolayer resist process in order to make an etching load of the monolayer resist film light, whereas the contrary characteristics are required for a resist lower layer film in a multilayer resist process. Moreover, in order to secure a sufficient etching resistance at the time of etching the substrate, it is necessary to make a thickness of the resist lower layer film as thick as a monolayer resist film, or more, namely as 300 nm or more. However, with a film thickness of 300 nm or more, change in a reflectivity due to change in a film thickness is almost converged, and the reflection preventing effect by control of phase difference cannot be expected.

The results of a calculated reflectivity of a substrate when a thickness of a resist lower layer film was changed in the range of 0–500 nm are shown in FIGS. 2 and 3. It is assumed that an exposure wavelength is 193 nm, n value of the resist upper layer film is 1.74, and k value is 0.02.

FIG. 2 shows a reflectivity of the substrate when k value of the resist lower layer film is fixed to 0.3, a vertical axis represents n value, a horizontal axis represents a thickness, the n value is varied in the range of 1.0–2.0, and a thickness is varied in the range of 0–500 nm. As shown in FIG. 2, assuming the resist lower layer film for a two-layer resist process with a thickness of 300 nm or more, there exists an optimal value where a reflectivity can be about 1% or less, when an index of refraction (n value) is as high as, or slightly higher than the resist upper layer film, namely is 1.6–1.9.

FIG. 3 shows a reflectivity when n value of the resist lower layer film is fixed to 1.5, a vertical axis represents k value, a horizontal axis represents a thickness, the k value is varied in 0–0.8, and a thickness is varied in 0–500 nm. As shown in FIG. 3, assuming the resist lower layer film for a two-layer resist process with a thickness of 300 nm or more, a reflectivity can be about 1% or less when k value is 0.24–0.15. On the other hand, the optimal k values of the antireflection film for a monolayer resist process used as the thin film as about 40 nm are 0.4–0.5, and differ from the optimal k value of the resist lower layer film for a two-layer resist process of which a thickness is 300 nm or more. As described above, it is shown that the lower k value (i.e., higher transparency) is necessary for the resist lower layer film for a two-layer resist process.

Then, a copolymer of a polyhydroxy styrene and an acrylic has been examined as a resist lower layer film material for a wavelength of 193 nm (for example, see SPIE Vol. 4345 p 50 (2001)). Polyhydroxy styrene has a very strong absorption at a wavelength of 193 nm, and the k value of itself is as high as about 0.6. Then, the k value is adjusted around 0.25 by carrying out copolymerization with the acrylic of which k value is almost 0.

However, etching resistance of acrylic is low at etching of the substrate, compared with etching resistance of polyhydroxy styrene, and the acrylic need to be copolymerized at a significant rate in order to lower the k value. As a result, the etching resistance at the time of etching of the substrate is significantly lowered. The etching resistance appears not only in an etch rate but in generation of surface roughness after etching. The increase of surface roughness after etching becomes serious due to copolymerization of the acrylic.

Then, it has been proposed to use a naphthalene ring which is one of those wherein a transparency at a wavelength of 193 nm is higher than a benzene ring and etching resistance is high. For example, there has been proposed a resist lower layer film which has a naphthalene ring or an anthracene ring (for example, see Japanese Patent Application Laid-open (KOKAI) No. 2002-14474). However, the k value of a naphthol copolycondensation novolak resin and a polyvinyl naphthalene resin is between 0.3 and 0.4, and does not reach a desired transparency of 0.1 to 3, and thus it is necessary to raise a transparency further in order to achieve a desired reflection preventing effect. Moreover, the n value at a wavelength of 193 nm of a naphthol copolycondensation novolak resin and polyvinyl naphthalene resin is low, and it is 1.4 in the case of a naphthol copolycondensation novolak resin, and is 1.2 in the case of a polyvinyl naphthalene resin as measured by the inventors of the present invention, which do not reach the desired range of value. Furthermore, although the acenaphthylene polymer is proposed (for example, see Japanese Patent Application Laid-open (KOKAI) No. 2001-40293 and Japanese Patent Application Laid-open (KOKAI) No. 2002-214777), the n value at a wavelength of 193 nm is lower than at a wavelength of 248 nm, k value is high, and neither of the desired values is achieved.

As described above, there is a need for the resist lower layer film which has the high n value and the low k value, is transparent, and has a high etching resistance.

SUMMARY OF THE INVENTION

The present invention has been made in order to solve such problems. The object of the present invention is to provide a resist lower layer film material for a multilayer-resist process such as those wherein a resist upper layer film contains silicon, especially for a two-layer resist process, which functions as an excellent antireflection film especially for exposure with a short wavelength, namely has higher transparency than polyhydroxy styrene, cresol novolak, naphthol novolak or the like, and has the optimal n value and k value, and is excellent in an etching resistance in substrate processing, and to provide a method for forming a pattern on a substrate by lithography using it.

To achieve the above mentioned object, the present invention provides a resist lower layer film material for a multilayer-resist film used in lithography which contains a polymer having at least a repeating unit represented by the following general formula (1).

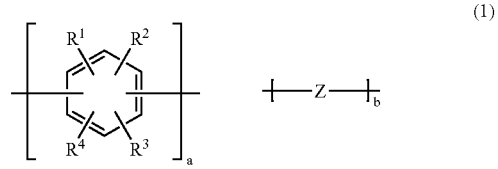

(In the above-mentioned general formula (1), $R^1$–$R^4$ independently represent any one of a-hydrogen atom, a hydroxyl group, an alkyl group having 1–20 carbon atoms, an alkoxy group having 1–20 carbon atoms, an alkoxy carbonyl group having 1–20 carbon atoms, an acetoxy group, an aryl group having 6–10 carbon atoms, a hydroxy alkyl group having 1–6 carbon atoms, a hydroxy alkoxy group, an isocyanate group and a glycidyl ether group, or an organic group represented by the following general formula (2), and at least one of $R^1$–$R^4$ is the organic group represented by the following general formula (2). In the above-mentioned general formula (1), Z is a cycloaliphatic hydrocarbon group, and a and b are positive numbers.)

(In the above-mentioned general formula (2), $R^5$ represents an alkylene group having 1–4 carbon atoms, and $R^6$ represents an alkyl group having 4–20 carbon atoms which has a cyclic structure, or an aryl group having 6–20 carbon atoms.)

The resist lower layer film wherein the resist lower layer film material containing the polymer which has at least the repeating unit represented by the above-mentioned general formula (1) is used as described above, functions as an excellent antireflection film especially to exposure with a short wavelength, namely, has a high transparency, and has the optimal n value and k value, and is excellent in an etching resistance at the time of substrate processing.

It is desirable that the resist lower layer film material of the present invention further contains any one or more of a cross linking agent, an acid generating agent, and an organic solvent.

As described above, if the resist lower layer film material of the present invention further contains any one or more of an organic solvent, a cross linking agent, and an acid generating agent, an application property of the material can be improved, or the crosslinking reaction in the resist lower layer film can be promoted by baking or the like after application to a substrate. Therefore, in such a resist lower layer film, a uniformity of a thickness of the film is excellent, there is little possibility of intermixing with the resist upper layer film, and there is few diffusion of a low molecular component to the resist upper layer film.

Furthermore, the present invention provides a method of forming a pattern on a substrate by lithography wherein, at least, a resist lower layer film is formed on a substrate using the resist lower layer film material of the present invention, one or more layers of the resist upper layer film of a photoresist composition are formed on this lower layer film, to form a multilayer-resist film, a pattern circuit area of this multilayer-resist film is exposed and developed with a developer to form a resist pattern on the resist upper layer film, the resist lower layer film is etched using as a mask the resist upper layer film on which the pattern is formed, and then the substrate is etched using as a mask the multilayer-resist film on which the pattern is formed, to form a pattern on the substrate.

As described above, if a pattern is formed by lithography using the resist lower layer film material of the present invention, the pattern can be formed on the substrate with high accuracy.

In this case, the above-mentioned resist upper layer film containing a silicon atom may be used, and etching of the lower layer film using as a mask the above-mentioned resist upper layer film can be performed by dry etching using a gas mainly containing oxygen gas.

As described above, the resist lower layer film of the present invention is especially preferable, when the resist upper layer film containing a silicon atom is used, and etching of the lower layer film using as a mask the resist upper layer film is performed by dry etching using a gas mainly containing oxygen gas, to form a pattern. Therefore, if a substrate is etched using the multilayer-resist film as a mask to form a pattern on the substrate, a highly precise pattern can be formed.

The etching of the substrate using as a mask the multilayer-resist film on which the pattern is formed can be performed by dry etching using a gas mainly containing any one of chlorofluocarbon gas, chlorine gas and bromine gas.

The resist lower layer film of the present invention is excellent especially in etching resistance in the dry etching using a gas mainly containing any one of chlorofluocarbon gas, chlorine gas and bromine gas. Therefore, if a substrate is etched using the multilayer-resist film as a mask, and the pattern is formed on the substrate by dry etching using a gas mainly containing any one of chlorofluocarbon gas, chlorine gas, and bromine gas, a highly precise pattern can be formed.

As explained above, according to the present invention, there can be obtained the resist lower layer film material for a multilayer-resist process, specially for two-layer resist process, such as those wherein the resist upper layer film contains silicon, which functions as an excellent antireflection film especially for exposure with a short wavelength, namely, has higher transparency than polyhydroxy styrene, cresol novolak, naphthol novolak, or the like, and has the optimal n value (index of refraction) and k value (extinction coefficient), and is excellent in etching resistance in substrate processing.

BRIEF DESCRIPTION OF THE DRAWINGS

FIG. 2 is a graph which shows the relation between a thickness of an resist lower layer film and reflectivity when the extinction coefficient k of the resist lower layer film is fixed to 0.3, and a refractive index n is varied in the range of 1.0 to 2.0 (exposure wavelength is 193 nm, the n value of the resist upper layer film is 1.74, and the k value is 0.02).

DESCRIPTION OF THE INVENTION AND EMBODIMENT

Figure 1:
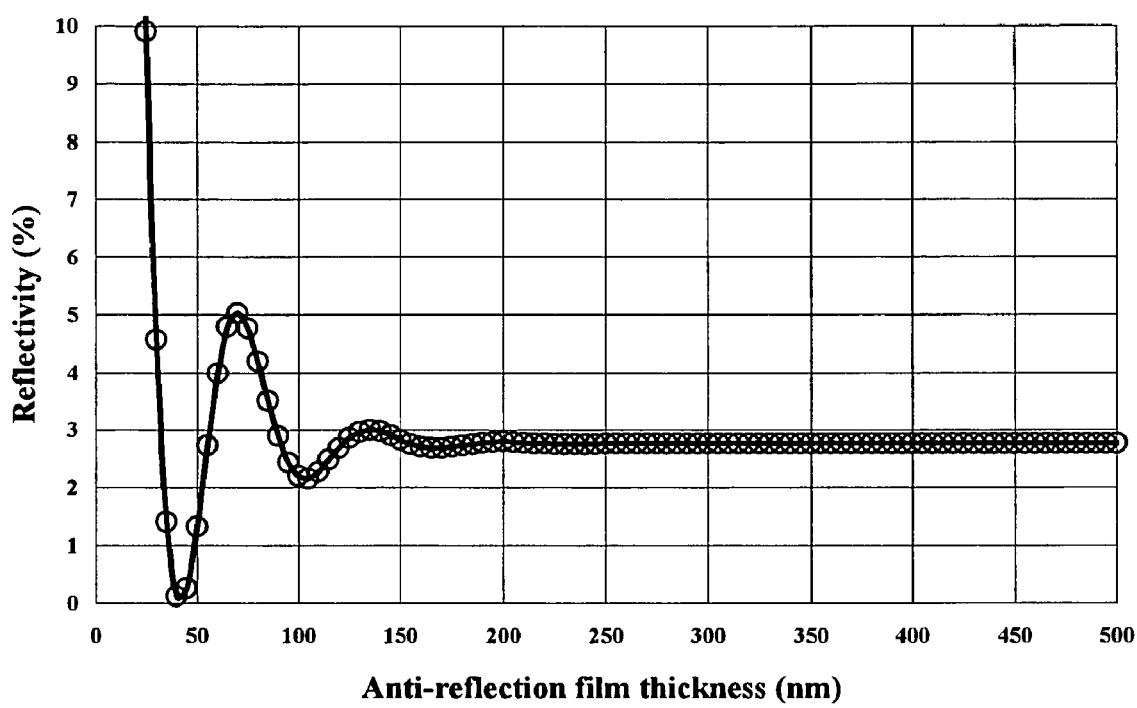
FIG. 1 is a graph which shows the relation between a thickness of a resist lower layer film and reflectivity.
Figure 3:
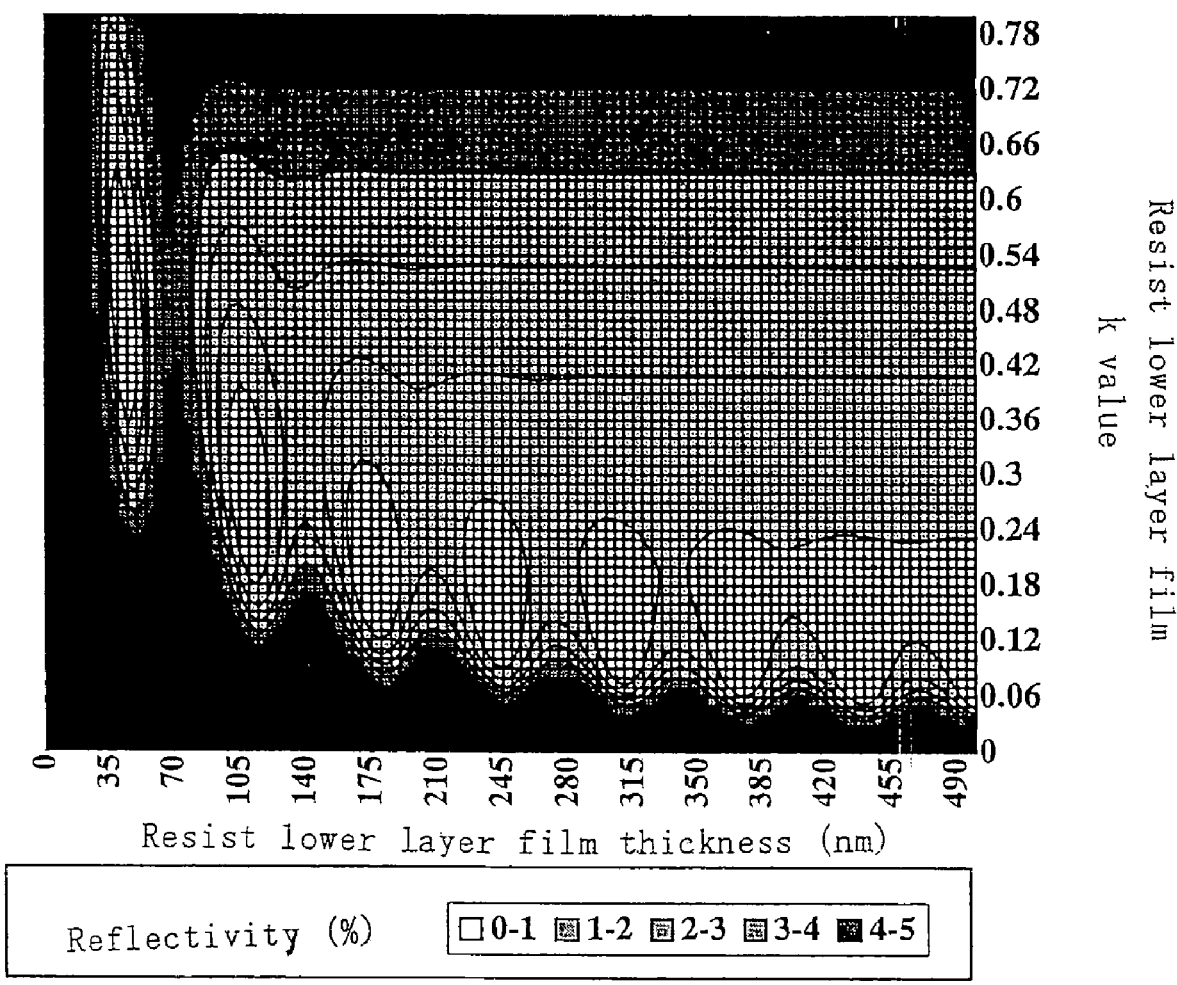
FIG. 3 is a graph which shows the relation between a thickness of an resist lower layer film and reflectivity when a refractive index n of the resist lower layer film is fixed to 1.5, and the quenching coefficient k is varied in the range of 0 to 0.8 (exposure wavelength is 193 nm, the n value of the resist upper layer film is 1.74, and the k value is 0.02).

Hereafter, the present invention will be explained.

The inventors of the present invention have studied further, and found that a copolycondensation product of an aromatic compound such as phenols from which an alkyl group which has a cyclic structure or an aryl group is suspended via an alkylene group, and a cycloaliphatic hydrocarbon such as dicyclopentadiene is the material which has the optimal n value and k value in exposure at a short wavelength, for example at a wavelength of 193 nm and is excellent also in an etching resistance at the time of etching of the substrate.

There has been shown i-line resist using as a base a copolycondensation polymer of cresol and dicyclopentadiene in Japanese Patent Application Laid-open (KOKAI) No. 6-202317, Japanese Patent Application Laid-open (KOKAI) No. 8-179502, Japanese Patent Application Laid-open (KOKAI) No. 8-220750, Japanese Patent Application Laid-open (KOKAI) No. 8-292565, and Japanese Patent Application Laid-open (KOKAI) No. 9-15855, and examined as for copolymerization with dicyclopentadiene as a more highly transparent novolak resin. There has been proposed a cured resin which is a copolycondensation polymer of resol and dicyclopentadiene from which a glycidyl group is suspended in Japanese Patent Application Laid-open (KOKAI) No. 10-282666.

Namely, they were applied according to the present invention, and a material containing as a base an aromatic compound-cycloaliphatic hydrocarbon condensation product such as copolycondensation novolak resin of phenols from which an alkyl group which has a cyclic structure or an aryl group is suspended via an alkylene group and dicyclopentadiene, which is excellent in the reflective prevention effect at a thickness of 200 nm or more especially at a wavelength of 193 nm, and is excellent in etching resistance, is used as a novel resist lower layer film material applicable for a multilayer-resist process such as a two layer resist process containing silicon. Thereby, there is provided a resist lower layer film having the optimal n value and k value, wherein it was made possible to suppress the reflection of a substrate and excellent in etching resistance under the condition of etching of the substrate.

Hereafter, embodiments of the present invention will be explained. However, the present invention is not limited thereto.

The present invention provides a resist lower layer film material for a multilayer-resist film used in lithography which contains a polymer having at least a repeating unit represented by the following general formula (1).

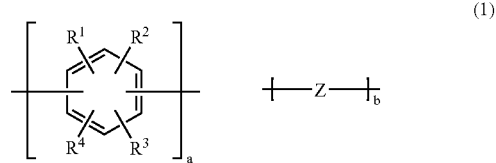

(In the above-mentioned general formula (1), R¹–R⁴ independently represent any one of a hydrogen atom, a hydroxyl group, an alkyl group having 1–20 carbon atoms, an alkoxy group having 1–20 carbon atoms, an alkoxy carbonyl group having 1–20 carbon atoms, an acetoxy group, an aryl group having 6–10 carbon atoms, a hydroxy alkyl group having 1–6 carbon atoms, a hydroxy alkoxy group, an isocyanate group and a glycidyl ether group, or an organic group represented by the following general formula (2), and at least one of $R^1$–$R^4$ is the organic group represented by the following general formula (2). In the above-mentioned general formula (1), Z is a cycloaliphatic hydrocarbon group, and a and b are positive numbers.

 (2)

(In the above-mentioned general formula (2), $R^5$ represents an alkylene group having 1–4 carbon atoms, and $R^6$ represents an alkyl group having 4–20 carbon atoms which has a cyclic structure, or an aryl group having 6–20 carbon atoms.)

When the resist lower layer film material is allowed to contain any one or more of an organic solvent, a cross linking agent, and an acid generating agent further, an application property to the substrate or the like of this material can be improved, or a crosslinking reaction in the resist lower layer film can be promoted by baking or the like after application. Therefore, such a resist lower layer film has a good thickness uniformity, there is little possibility of intermixing with the resist upper layer film, and diffusion of the low molecular component to the resist upper layer film is few.

Examples of the phenols for obtaining the repeating unit a in the general formula (1) may include: phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethyl phenol, 3,4,5-trimethyl phenol, 2-t-butylphenol, 3-t-butylphenol, 4-t-butylphenol, resorcinol, 2-methyl resorcinol, 4-methyl resorcinol, 5-methyl resorcinol, catechol, 4-t-butylcatechol, 2-methoxy phenol, 3-methoxy phenol, 2-propyl phenol, 3-propyl phenol, 4-propyl phenol, 2-isopropyl phenol, 3-isopropyl phenol, 4-isopropyl phenol, 2-methoxy-5-methyl phenol, 2-t-butyl-5-methyl phenol, pyrogallol, thymol, isothymol and the like.

A monomer for obtaining a cycloaliphatic-hydrocarbon group in the repeating unit b in the general formula (1) may be an unsaturated alicyclic compound. Specific examples thereof include: dicyclopentadiene, bicyclo(4,3,0) nona-3,7-diene, 4-vinyl cyclohexene, norbornadiene, 5-vinylnorborna-2-en, α-pinene, β-pinene, limonene, and the like. However, it is not limited thereto. Among them, dicyclopentadiene may be used preferably. Although dicyclopentadiene is a dimer of a cyclopentadiene and there are two isomers, endo form and exo form, dicyclopentadiene used as the raw material of the resin used for the present invention may be either of isomers, and may be a mixture of two of the isomers. When using a mixture of the isomers, the ratio of the isomers is not restricted.

A method for producing a polymer represented by the general formula (1) will be explained below referring to an addition reaction of an unsaturated cycloaliphatic compound and phenols as an example. However, the present invention is not limited thereto.

The polymer represented by the general formula (1) can be obtained by carrying out the addition reaction of an unsaturated cycloaliphatic compound and phenols in the presence of an acid catalyst.

Examples of the acid catalyst used for the reaction may include: Lewis acids such as an ethanol complex of boron trifluoride and aluminum chloride, an inorganic acid such as hydrochloric acid, nitric acid and sulfuric acid, a sulfonic acid such as methansulfonic acid, n-butane sulfonic acid, benzenesulfonic acid, p-toluenesulfonic acid, m-xylene sulfonic acid, p-xylene sulfonic acid and mesitylene sulfonic acid, a super-strong acid such as perfluoro sulfonic acid such as trifluoromethane sulfonic acid, nonafluoro methansulfonic acid and a pentafluorobenzene sulfonic acid, an anion exchange resin such as perfluoro alkyl polymer having an end sulfonic-acid group such as naphyone, polystyrene with a sulfonic-acid residue, and the like. Methansulfonic acid, tosyl acid, and trifluoromethane sulfonic acid are especially desirable. An amount of the catalyst to be used may be in the range of 0.01 to 10% by weight, preferably 0.05–5% by weight to a raw material in the case of methansulfonic acid. An amount of the catalyst to be used may be in the range of 0.001 to 10% by weight, preferably 0.005–5% by weight to a raw material in the case of tosyl acid. An amount of the catalyst to be used may be 0.0001 to 5% by weight, preferably 0.0005–1% by weight to a raw material in the case of a trifluoromethane sulfonic acid.

A ratio of phenols and an unsaturated cycloaliphatic compound is 0.1–2.0 mols, preferably 0.2–1.8 mols of an unsaturated cycloaliphatic compound to one mol of phenols.

The reaction is classified to the first step by which an addition reaction of an unsaturated cycloaliphatic compound with a hydroxyl group of phenols and etherification are carried out, and the second step by which a phenol resin is formed by a rearrangement reaction of the ether. A reaction temperature is in the range of 20–200° C., preferably 40–160° C. Although a phenol-unsaturated cycloaliphatic compound resin can be obtained by evaporating an unreacted phenol compound according to an arbitrary method after completion of the reaction, it is desirable to introduce a washing process when being used for the purpose of the present invention. An arbitrary washing method may be carried out. For example, there can be carried out a method of removing an insoluble component as an alkali metal salt using a hydroxide of an alkali metal, a method of conducting water-washing using an organic solvent such as aromatic hydrocarbons such as toluene and xylene, ketones such as methyl ethyl ketone and methyl isobutyl ketone, higher alcohols such as amyl alcohol, isoamyl alcohol, heptanol, 2-heptanol, octanol and isooctanol, or the like, a method of conducting a dilute-hydrochloric-acid washing using the above-mentioned organic solvent, and a method of treating with adsorbents such as silica gel, alumina, activated carbon or the like using a solvent such as 1,2-dichloroethane, chloroform, methyl cellosolve, ethyl cellosolve, dimethylformamide, dimethylacetamide or the like. It is desirable to reduce impurities, such as a gel component, an acidic component, and a metal ion, as much as possible with any one of these methods or a combination of these methods.

A weight average molecular weight is preferably in the range of 1,500–200,000, and more preferably in the range of 2,000–10,000. A molecular weight distribution is not limited specially. It is possible to remove a low molecular substance and a high molecular substance by fractionation to make a degree of dispersion small. It is also possible to mix two or more kinds of a phenol-unsaturated cycloaliphatic compound resin having a different molecular weight or a different degree of dispersion, or to mix two or more kinds of a phenol-unsaturated cycloaliphatic compound resin having a different composition ratio.

The present invention is characterized in that, for example, a polymer wherein phenols and an unsaturated cycloaliphatic compound are copolycondensated is applied as a resist lower layer film. However, other monomers which can be copolymerized can be copolymerized therewith.

Examples of other monomers which can be copolymerized may include: 1-naphthol, 2-naphthol, 2-methy-1-naphthol, 4-methoxy-1-naphthol, 7-methoxy-2-naphthol, dihydroxy naphthalenes such as 1,5-dihydroxy naphthalene, 1,7-dihydroxy naphthalene and 2,6-dihydroxy naphthalene, methyl 3-hydroxy-naphthalene-2-carboxylate, indene, hydroxy anthracene, acenaphthylene, biphenyl and the like. The copolymer may consist of three or more kinds of monomers including them.

The ratio of the above-mentioned phenols and unsaturated cycloaliphatic compound which are copolycondensated is such that the unsaturated cycloaliphatic compound may be 0.1 to 2.0 mol, and more preferably 0.2 to 1.8 mol to one mol of the phenols.

Specific examples of the organic group represented by the general formula (2) may be listed below.

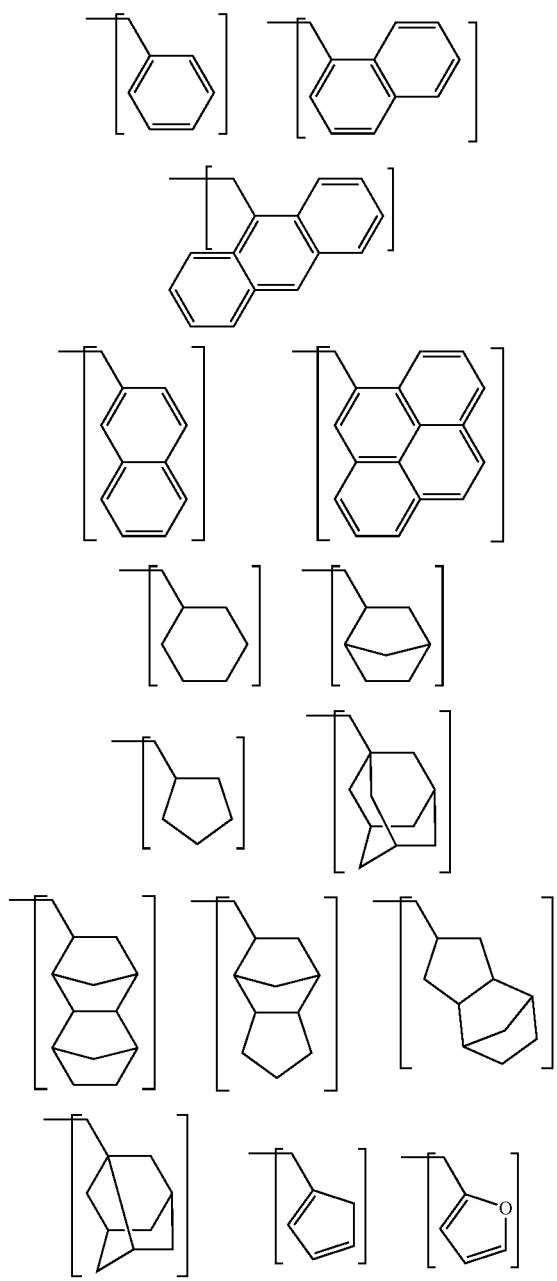

-continued

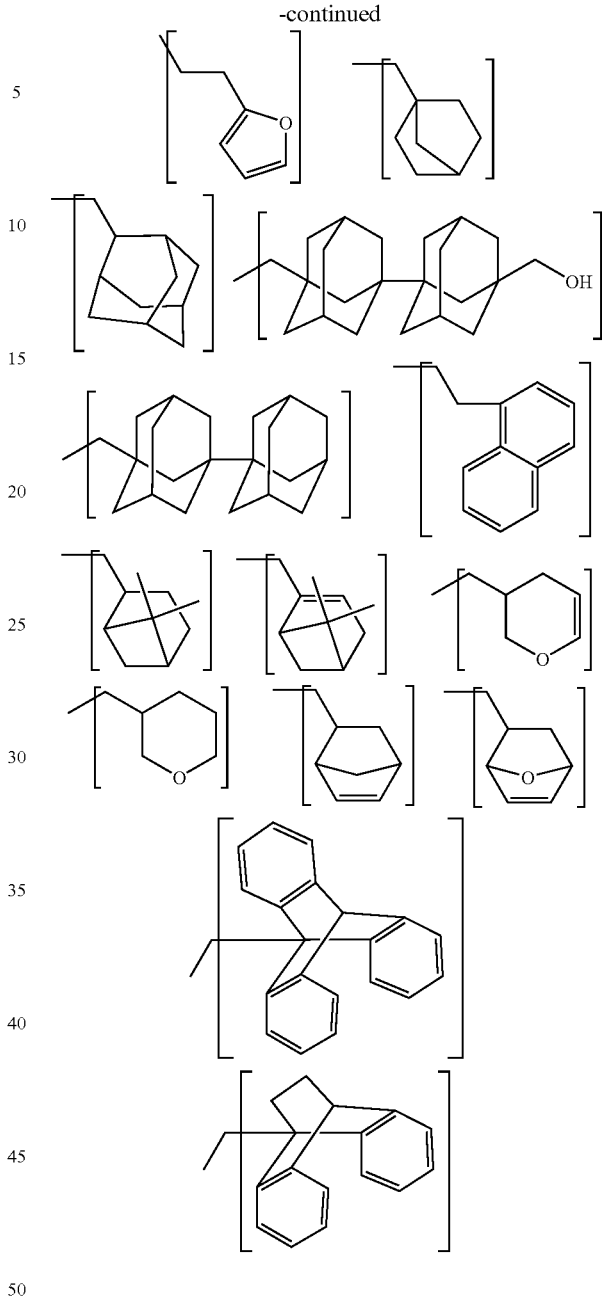

The organic group represented by the general formula (2) which is preferably used is those having a cycloaliphatic structure or a naphthalene structure for improvement of etching resistance and transparency at a wavelength of 193 nm. On the other hand, absorption of a benzene ring at a wavelength of 157 nm is too small, and thus it is not practical as an anti-reflection film. Accordingly, it is necessary to lower transparency to increase the absorption. A benzene ring has a window where a transparency is improved at a wavelength of around 157 nm and thus absorption is not enough for obtaining a reflection preventing effect. Accordingly, it is necessary to raise the absorption by shifting an absorption wavelength. A furan ring has absorption at a shorter wavelength than a benzene ring, and the absorption at a wavelength of 157 nm is somewhat improved. However, the effect is small. A naphthalene ring, an anthracene ring and a pyrene ring can increase absorption, since absorption wavelength gets longer. And those containing these aromatic rings can achieve the effect of improving an etching resistance. Accordingly, they can be used preferably.

As a method of introducing the organic group represented by the general formula (2), a method of introducing an alcohol represented by the following general formula (3) to ortho position of phenol in the presence of an acid catalyst is generally conducted.

$$HO-R^5-R^6 \quad (3)$$

A reaction of introducing the organic group represented by the general formula (2) can be conducted to phenols-unsaturated cycloaliphatic compound novolak resins after condensation. Alternatively, the organic group can be introduced simultaneously with condensation of phenols-unsaturated cycloaliphatic compound novolak.

As the acid catalyst, there can be used the above mentioned catalysts which are listed for the condensation reaction of phenols-unsaturated cycloaliphatic compound novolak.

Hydrogenation can be performed in order to raise a transparency of a phenol-cycloaliphatic compound copolymerization resin of the present invention further. A desirable rate of hydrogenation is 50 mol % or less of an aromatic group, such as phenol.

Although a base resin for the resist lower layer film material of the present invention is characterized in containing an aromatic compound-cycloaliphatic compound resin such as a phenol-unsaturated cycloaliphatic compound resin, it can also be blended with conventional polymer mentioned above as the antireflection film material.

When a glass transition point of a phenol-unsaturated cycloaliphatic compound resin is 180° C. or more, embedding characteristics of deep holes, such as a via hole, may be inferior when being used alone. The technique of embedding a resin, which contains a polymer having a low glass transition point, to the bottom of a hole with flowing the resin by heat of a temperature lower than a crosslinking temperature is used in order to embed a hole without generation of a void (for example, see Japanese Patent Application Laid-open (KOKAI) No. 2000-294504). A glass transition point can be lowered and the embedding characteristics of a via hole can be improved by blending with a polymer with a low glass transition point, preferably a polymer with a low glass transition point of 180° C. or less, especially a polymer with a glass transition points of 100–170° C., for example, an acrylic derivative, vinyl alcohol, vinyl ether, allyl-ethers, a styrene derivative, an allyl-benzene derivative, olefins such as ethylene, propylene and butadiene, a polymer by metathesis ring opening polymerization, or the like.

In this case, a blending rate of the copolycondensation polymer of phenols and a unsaturated cycloaliphatic compound, and the above-mentioned polymer having a low glass transition point is preferably 1:0.1 to 1:10, especially 1:0.2 to 1:5, by weight.

As other methods of lowering a glass transition point, there can be mentioned a method of condensating phenols substituted with a long chain alkyl, or a method of substituting a hydrogen of a hydroxy group of an aromatic compound-cycloaliphatic compound polymer such as a phenol-unsaturated cycloaliphatic compound novolak resin with a straight, branched or cyclic alkyl group having 1–20 carbon atoms, an acid unstable group such as t-butyl group, t-amyl group and an acetal group, an acetyl group, a pivaloyl group, or the like.

A substitution ratio at this time is in the range of 10–60 mol %, preferably 15–50 mol % of a hydroxyl group of a phenol-unsaturated cycloaliphatic compound novolak resin.

As one of performances required for a resist lower layer film, it is mentioned that there is no intermixing with the resist upper layer film and that there is no diffusion of the low molecule component to the resist upper layer film (Proc. SPIE Vol. 2195, p 225–229 (1994)). In order to prevent them, there is generally adopted the method of forming a resist lower layer film on a substrate by a spin coat method or the like and then, carrying out thermal crosslinking by baking. Therefore, a cross linking agent can be added as a component of the resist lower layer film material, or a substituent which can carrying out crosslinking can be introduced into a polymer in the present invention.

Specific examples of the cross linking agent which can be used according to the present invention may include: a melamine compound, a guanamine compound, a glycol uryl compound or a urea compound substituted with at least one group chosen from a methylol group, an alkoxy methyl group, and an acyloxy methyl group, an epoxy compound, an isocyanate compound, an azide compound, a compound including a double bond such as an alkenyl ether group, and the like. Although they may be used as an additive, they can be introduced into a polymer side chain as a pendant group. Moreover, a compound containing a hydroxy group can also be used as a crosslinking agent.

Examples of the epoxy compound among the above-mentioned specific examples of the crosslinking agent may include: tris(2,3-epoxypropyl)isocyanurate, trimethylol methanetriglycidyl ether, trimethylol propane triglycidyl ether, triethylol ethanetriglycidyl ether, and the like. Specific examples of the melamine compound may include: hexamethylol melamine, hexamethoxy methyl melamine, a compound in which 1–6 methylol groups of hexamethylol melamine are methoxy methylated or a mixture thereof, hexamethoxy ethyl melamine, hexaacyloxy methyl melamine, and a compound in which 1–6 methylol groups of hexamethylol melamine are acyloxy methylated or a mixture thereof, or the like. Examples of a guanamine compound may include: tetramethylol guanamine, tetra methoxy methyl guanamine, a compound in which 1–4 methylol groups of tetramethylol guanamine are methoxy-methylated and a mixture thereof, tetramethoxy ethyl guanamine, tetraacyloxy guanamine, a compound in which 1–4 methylol groups of tetramethylol guanamine are acyloxy-methylated and a mixture thereof, and the like. Examples of a glycol uryl compound may include: tetramethylol glycol uryl, tetramethoxy glycol uryl, tetramethoxy methyl-glycol uryl, a compound in which 1–4 methylol groups of tetramethylol glycol uryl are methoxy-methylated or a mixture thereof, a compound in which 1–4 methylol group of tetramethylol glycol uryl are acyloxy methylated or a mixture thereof, and the like. Examples of a urea compound may include: tetra methylol urea, tetra methoxy methyl urea, a compound in which 1–4 methylol groups of tetra methylol urea are methoxy-methylated or a mixture thereof, tetra methoxy ethyl urea and the like.

Examples of the isocyanate compound may include: tolylene diisocyanate, diphenyl methane diisocyanate, hexamethylene diisocyanate, cyclohexane diisocyanate, and the like. Examples of the azide compound may include: 1,1'-biphenyl-4,4'-bisazide, 4,4'-methylidyne bisazide, and 4,4'-oxy-bisazide, and the like.

Examples of the compound containing an alkenyl ether group may include: ethylene glycol divinyl ether, triethylene-glycol divinyl ether, 1,2-propanediol divinyl ether, 1,4- butanediol divinyl ether, tetramethylene-glycol divinyl ether, neo pentyl glycol divinyl ether, trimethylol-propane trivinyl ether, hexane diol divinyl ether, 1,4-cyclohexane diol divinyl ether, pentaerythritol trivinyl ether, pentaerythritol tetra vinyl ether, sorbitol tetra vinyl ether, sorbitol penta vinyl ether, and trimethylol-propane trivinyl ether, or the like.

When hydroxy group(s) of the polymer represented by the general formula (1), for example, phenol-unsaturated cycloaliphatic compound resin, is substituted with a glycidyl group, addition of a compound containing a hydroxy group is effective. The compound which contains two or more hydroxy groups in a molecule is especially desirable. Examples of the compound containing hydroxy group(s) may include: a compound containing an alkoxy group such as naphthol novolak, m- and p-cresol novolak, a naphthol dicyclopentadiene novolak, m- and p-cresol dicyclopentadiene novolak, 4,8-bis(hydroxymethyl) tricyclo [$5.2.1.0^{2,6}$]-decane, pentaerythritol, 1,2,6-hexanetriol, 4,4',4"-methylidene tris cyclohexanol, 4,4'-[1-[4-[1-(4-hydroxy cyclohexyl)-1-methylethyl]phenyl]ethylidene]biscyclohexanol, [1,1'-bicyclohexyl]-4,4'-diol, methylene biscyclohexanol, decahydro naphthalene-2,6-diol, and [1,1'-bicyclohexyl]-3,3',4,4'-tetrahydroxy or the like; and a phenol containing less benzene nuclei, such as bisphenol, methylene bisphenol, 2, 2'-methylene bis [4-methyl phenol], 4,4'-methylidene-bis[2,6-dimethylphenol], 4,4'-(1-methyl-ethylidene) bis [2-methyl phenol], 4,4'-cyclohexylidene bisphenol, 4,4'-(1,3-dimethyl butylidene)bisphenol, 4,4'-(1-methyl-ethylidene) bis [2,6-dimethyl phenol], 4,4'-oxybisphenol, 4,4'-methylene bisphenol, bis(4-hydroxyphenyl) methanone, 4,4'-methylene bis[2-methylphenol], 4,4'-[1,4-phenylene bis(1-methyl ethylidene)]bisphenol, 4,4'-(1,2-ethane-di-yl) bisphenol, 4,4'-(diethyl silylene) bisphenol, 4,4'-[2,2,2-trifluoro-1-(trifluoromethyl) ethylidene]bisphenol, 4,4',4"-methylidene trisphenol, 4,4'-[1-(4-hydroxyphenyl)-1-methylethyl]phenyl]ethylidene]bisphenol, 2,6-bis[(2-hydroxy-5-methylphenyl)methyl]-4-methyl phenol, 4,4', 4"-ethylidyne tris[2-methyl phenol], 4,4',4"-ethylidyne trisphenol, 4,6-bis[(4-hydroxy phenyl)methyl]1,3-benzene diol, 4,4'-[(3,4-dihydroxy phenyl)methylene]bis[2-methylphenol], 4,4',4",4'''-(1, 2-ethanediylidene) tetrakisphenol, 4,4',4",4'''-ethanediylidene tetrakis[2-methylphenol], 2,2'-methylene bis [6-[(2-hydroxy-5-methylphenyl)methyl]-4-methylphenol], 4,4',4",4'''-(1,4-phenylene dimethylidyne) tetrakisphenol, 2,4,6-tris(4-hydroxy phenylmethyl)-1,3-benzenediol, 2,4',4"-methylidene trisphenol, 4,4',4"'-(3-methyl-1-propanyl-3-ylidene) trisphenol, 2,6-bis[(4-hydroxy-3-phlorophenyl) methyl]-4-fluorophenol, 2,6-bis[4-hydroxy-3-fluorophenyl]methyl]-4-fluorophenol, 3,6-bis[(3,5-dimethyl-4-hydroxyphenyl)methyl]1,2-benzenediol, 4,6-bis[(3,5-dimethyl-4-hydroxy phenyl)methyl]1,3-benzenediol, p-methylcalics[4]allene, 2,2'-methylene bis[6-[(2,5/3,6-dimethyl-4/2-hydroxyphenyl)methyl]-4-methylphenol, 2,2'-methylene bis[6-[(3,5-dimethyl-4-hydroxyphenyl) methyl]-4-methyl phenol, 4,4',4",4'''-tetrakis[(1-methyl ethylidene) bis(1,4-cyclohexylidene)]-phenol, 6,6'-methylene bis[4-(4-hydroxy phenyl methyl)-1,2,3-benzentriol, 3,3',5,5'-tetrakis[(5-methyl-2-hydroxyphenyl)methyl]-[(1,1'-biphenyl)-4,4'-diol], and the like.

The amount of the cross linking agent to be blended in the resist lower layer film material of the present invention is preferably 5 to 50 parts (it means parts by weight hereafter), especially 10 to 40 parts to 100 parts of the base polymer (total resin). If it is less than 5 parts, mixing with a resist upper layer film may be caused. If it exceeds 50 parts, the reflection prevention effect may be lowered, or a crack may be sometimes caused in the film after crosslinking.

In the resist lower layer film material of the present invention, the acid generating agent for promoting a crosslinking reaction by heat or the like further can be added. There are an acid generating agent which generates an acid by thermal decomposition and an acid generating agent which generates an acid by optical irradiation, and either of the acid generating agents can be added.

Examples of the acid generating agent used in the resist lower layer film material of the present invention are as follow:

i) an onium salt represented by the following general formula (P 1a-1), (P 1a-2), (P 1a-3) or (P 1b), ii) a diazomethane derivative represented by the following general formula (P 2), iii) a glyoxime derivative represented by the following general formula (P 3), iv) a bis sulfone derivative represented by the following general formula (P 4), v) a sulfonate of a N-hydroxy imide compound represented by the following general formula (P 5), vi) a β-keto sulfonic-acid derivative, vii) a disulfone derivative, viii) a nitro benzyl sulfonate derivative, ix) a sulfonate derivative, or the like.

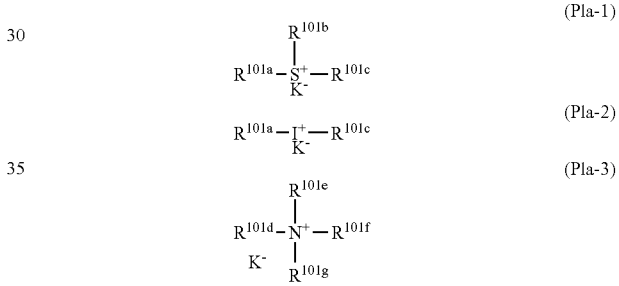

(In the formulae, $R^{101a}$, $R^{101b}$, and $R^{101c}$ independently represent a straight, branched or cyclic alkyl group, alkenyl group, oxoalkyl group or oxoalkenyl group each having 1–12 carbon atoms, an aryl group having 6–20 carbon atoms, an aralkyl group or an aryl oxoalkyl group having 7–12 carbon atoms. Some or all of hydrogen atoms of these groups may be substituted with an alkoxy group or the like. $R^{101b}$ and $R^{101c}$ may constitute a ring. In the case that they constitute a ring, $R^{101b}$ and $R^{101c}$ represent an alkylene group having 1–6 carbon atoms respectively. $K^-$ represents a non-nucleophilic counter ion. $R^{101d}$, $R^{101e}$, $R^{101f}$ and $R^{101g}$ are represented by adding a hydrogen atom to $R^{101a}$, $R^{101b}$, and $R^{101c}$, $R^{101d}$ and $R^{101e}$, and $R^{101d}$, $R^{101e}$ and $R^{101f}$ can be bonded respectively, and form a ring. When they form a ring, $R^{101d}$ and $R^{101e}$, and $R^{101d}$, $R^{101e}$ and $R^{101f}$ represent an alkylene group having 3–10 carbon atoms.)

The above-mentioned $R^{101a}$, $R^{101b}$, $R^{101c}$, $R^{101d}$, $R^{101e}$, $R^{101f}$ and $R^{101g}$ may be the same or different. Specific examples thereof as an alkyl group may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cycloheptyl group, a cyclopropyl methyl group, 4-methyl cyclohexyl group, a cyclohexyl methyl group, a norbornyl group, and an adamantyl group, or the like. Specific examples of an alkenyl group may include: a vinyl group, an allyl group, a propenyl group, a butenyl group, a hexenyl group, and a cyclohexenyl group, or the like. Examples of an oxo alkyl group may include: 2-oxocyclopentyl group, 2-oxocyclohexyl group, 2-oxopropyl group, 2-cyclopentyl-2-oxoethyl group, 2-cyclohexyl-2-oxoethyl group, 2-(4-methylcyclohexyl)-2-oxoethyl group, and the like. Examples of the oxoalkenyl group may include: 2-oxo-4-cyclohexenyl group, 2-oxo-4-propenyl group and the like. Examples of an aryl group may include: a phenyl group, a naphthyl group and the like, and an alkoxy phenyl group such as p-methoxyphenyl group, m-methoxyphenyl group, o-methoxyphenyl group, an ethoxyphenyl group, p-tert-butoxyphenyl group and m-tert-butoxy phenyl group, an alkyl phenyl group such as 2-methylphenyl group, 3-methylphenyl group, 4-methylphenyl group, an ethylphenyl group, 4-tert-butylphenyl group, 4-butylphenyl group, a dimethyl phenyl group and the like, an alkyl naphthyl group such as a methylnaphthyl group, an ethyl naphthyl group and the like, an alkoxy naphthyl group such as a methoxy naphthyl group, an ethoxy naphthyl group and the like, a dialkyl naphthyl group such as a dimethyl naphthyl group and a diethyl naphthyl group and the like, a dialkoxy naphthyl group such as a dimethoxy naphthyl group and a diethoxy naphthyl group, and the like. Examples of the aralkyl group may include a benzyl group, a phenylethyl group, a phenethyl group and the like. Examples of an aryl oxoalkyl group may include: 2-aryl-2-oxoethyl group such as 2-phenyl-2-oxoethyl group, 2-(1-naphthyl)-2-oxoethyl group, and 2-(2-naphthyl)-2-oxoethyl group, or the like. Examples of an unnucleophilic counter ion as $K^-$ may include: a halide ion such as a chloride ion and a bromide ion, a fluoro alkyl sulfonate such as triflate, 1,1,1-trifluoro ethanesulfonate and nonafluoro butane sulfonate, an aryl sulfonate such as tosylate, benzene sulfonate, 4-fluorobenzene sulfonate, and 1,2,3,4,5-pentafluoro benzene sulfonate, and an alkyl sulfonate such as mesylate and butane sulfonate.

Although (P 1a-1) and (P 1a-2) have effects of both a photo acid generating agent and a thermal acid generating agent, (P 1a-3) acts as a thermal acid generating agent.

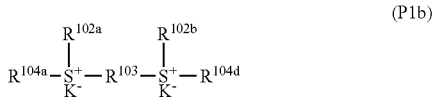

(P1b)

(In the formula, $R^{102a}$ and $R^{102b}$ each represent a straight, branched or cyclic alkyl group having 1–8 carbon atoms. $R^{103}$ represents a straight, branched or cyclic alkylene group having 1–10 carbon atoms. $R^{104a}$ and $R^{104b}$ each represent a 2-oxoalkyl group having 3–7 carbon atoms. $K^-$ represents an unnucleophilic counter ion.)

Specific examples of the above-mentioned $R^{102a}$ and $R^{102b}$ may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cyclopropylmethyl group, 4-methylcyclohexyl group, a cyclohexyl methyl group and the like. Examples of $R^{103}$ may include: a methylene group, an ethylene group, a propylene group, a butylene group, a pentylene group, a hexylene group, a heptylene group, an octylene group, a nonylene group, 1,4-cyclohexylene group, 1,2-cyclohexylene group, 1,3-cyclopentylene group, 1,4-cyclooctylene group, 1,4-cyclohexane dimethylene group and the like.

Examples of $R^{104a}$ and $R^{104b}$ may include: 2-oxopropyl group, 2-oxocyclopentyl group, 2-oxocyclohexyl group, 2-oxocycloheptyl group and the like. As $K^-$, the same as mentioned in the formulae (P 1a-1), (P 1a-2) and (P 1a-3) can be exemplified.

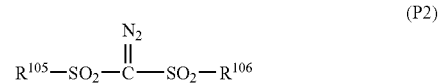

(P2)

(In the formula, $R^{105}$ and $R^{106}$ represent a straight, branched or cyclic alkyl group or alkyl-halide group having 1–12 carbon atoms, an aryl group or aryl-halide group having 6–20 carbon atoms, or an aralkyl group having 7–12 carbon atoms.)

Examples of an alkyl group as $R^{105}$ and $R^{106}$ may include: a methyl group, an ethyl group, a propyl group, an isopropyl group, n-butyl group, sec-butyl group, tert-butyl group, a pentyl group, a hexyl group, a heptyl group, an octyl group, an amyl group, a cyclopentyl group, a cyclohexyl group, a cycloheptyl group, a norbornyl group, an adamantyl group and the like. Examples of a halogenated alkyl group may include: trifluoromethyl group, 1,1,1-trifluoroethyl group, 1,1,1-trichloroethyl group, a nonafluoro butyl group and the like. Examples of the aryl group may include: a phenyl group, an alkoxyphenyl group such as p-methoxyphenyl group, m-methoxyphenyl group, o-methoxyphenyl group, an ethoxyphenyl group, p-tert-butoxyphenyl group and m-tert-butoxyphenyl group, and an alkylphenyl group such as 2-methylphenyl group, 3-methylphenyl group, 4-methylphenyl group, an ethylphenyl group, 4-tert-butylphenyl group, 4-butylphenyl group, and a dimethylphenyl group. Examples of the halogenated aryl group may include: a fluorophenyl group, a chlorophenyl group, 1,2,3,4,5-pentafluoro phenyl group and the like. Examples of the aralkyl group may include: a benzyl group, a phenethyl group, and the like.

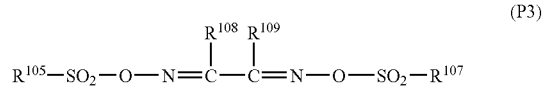

(P3)

(In the formula, $R^{107}$, $R^{108}$ and $R^{109}$ represent a straight, branched, cyclic alkyl group or halogenated alkyl group having 1–12 carbon atoms, an aryl group or a halogenated aryl group having 6–20 carbon atoms, or an aralkyl group having 7–12 carbon atoms. $R^{108}$ and $R^{109}$ may be bonded each other and form a cyclic structure. When they form a cyclic structure, $R^{108}$ and $R^{109}$ each represent a straight or branched alkylene group having 1–6 carbon atoms. $R^{105}$ represents the same meaning as that in the formula P 2.)

Examples of the alkyl group, the halogenated alkyl group, the aryl group, the halogenated aryl group, and the aralkyl group as $R^{107}$, $R^{108}$ and $R^{109}$ may be the same as exemplified for $R^{105}$ and $R^{106}$. In addition, as an alkylene group for $R^{108}$ and $R^{109}$, a methylene group, an ethylene group, a propylene group, a butylene group, a hexylene group and the like may be exemplified.

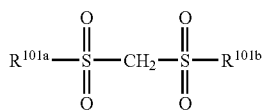

(P4)

wherein $R^{101a}$ and $R^{101b}$ are the same as explained above.

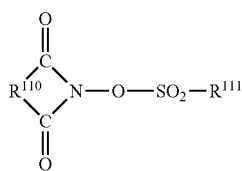

(P5)

(In the formula, $R^{110}$ represents an arylene group having 6–10 carbon atoms, an alkylene group having 1–6 carbon atoms or an alkenylene group having 2–6 carbon atoms. Some or all of hydrogen atoms of these groups may be further substituted with a straight, branched alkyl group or an alkoxy group having 1–4 carbon atoms, a nitro group, an acetyl group, or a phenyl group. $R^{111}$ represents a straight, branched or substituted alkyl group, alkenyl group or alkoxy alkyl group having 1–8 carbon atoms, a phenyl group or a naphthyl group. Some or all of hydrogen atoms of these groups may be substituted with an alkyl group or an alkoxy group having 1–4 carbon atoms; a phenyl group which may be substituted with an alkyl group or an alkoxy group having 1–4 carbon atoms, a nitro group or an acetyl group; a hetero aromatic group having 3–5 carbon atoms; or a chlorine atom or a fluorine atom.)

Examples of the arylene group as $R^{110}$ may include: 1,2-phenylene group, 1,8-naphtylene group and the like. Examples of the alkylene group may include: a methylene group, an ethylene group, a trimethylene group, a tetramethylene group, a phenylethylene group, a norbornane-2,3-di-yl group, and the like. Examples of the alkenylene group may include: 1,2-vinylene group, 1-phenyl-1,2-vinylene group, 5-norbornene-2,3-di-yl group and the like. Examples of the alkyl group as $R^{111}$ may be the same as exemplified for $R^{101a}$–$R^{101c}$. Examples of the alkenyl group as $R^{111}$ may include: a vinyl group, a 1-propenyl group, an allyl group, a 1-butenyl group, a 3-butenyl group, an isoprenyl group, a 1-pentenyl group, a 3-pentenyl group, a 4-pentenyl group, a dimethyl allyl group, a 1-hexenyl group, a 3-hexenyl group, a 5-hexenyl group, a 1-heptenyl group, a 3-heptenyl group, a 6-heptenyl group, a 7-octenyl group and the like. Examples of the alkoxy alkyl group may include: a methoxy methyl group, an ethoxy methyl group, a propoxy methyl group, a butoxy methyl group, a pentyloxy methyl group, a hexyloxy methyl group, a heptyloxy methyl group, a methoxy ethyl group, an ethoxy ethyl group, a propoxy ethyl group, a butoxy ethyl group, pentyloxy ethyl group, a hexyloxy ethyl group, a methoxy propyl group, an ethoxy propyl group, a propoxy propyl group, a butoxy propyl group, a methoxy butyl group, an ethoxy butyl group, a propoxy butyl group, a methoxy pentyl group, an ethoxy pentyl group, a methoxy hexyl group, a methoxy heptyl group and the like.

In addition, examples of the alkyl group having 1–4 carbon atoms which may be further substituted may include: a methyl group, an ethyl group, a propyl group, an isopropyl group, n-butyl group, an isobutyl group, a tert-butyl group and the like. Examples of the alkoxy group having 1–4 carbon atoms may include: a methoxy group, an ethoxy group, a propoxy group, an isopropoxy group, n-butoxy group, an isobutoxy group, a tert-butoxy group and the like. Examples of the phenyl group which may be substituted with an alkyl group and an alkoxy group having 1–4 carbon atoms, a nitro group or an acetyl group may include: a phenyl group, a tolyl group, p-tert-butoxy phenyl group, p-acetyl phenyl group, p-nitrophenyl group and the like. Examples of a hetero aromatic group having 3–5 carbon atoms may include: a pyridinyl group, a furil group and the like.

Specific examples of an acid generating agent may include: an onium salt such as trifluoromethane sulfonic acid tetramethyl ammonium, nonafluoro butane sulfonic acid tetramethyl ammonium, nonafluoro butane sulfonic-acid tetra n-butyl-ammonium, nonafluoro butane sulfonic-acid tetraphenyl ammonium, p-toluenesulfonic-acid tetramethyl ammonium, trifluoromethane sulfonic acid diphenyl iodinium, trifluoromethane sulfonic acid (p-tert-butoxy phenyl) phenyl iodinium, p-toluenesulfonic acid diphenyl iodinium, p-toluenesulfonic acid (p-tert-butoxy phenyl) phenyl iodinium, trifluoromethane sulfonic acid triphenyl sulfonium, trifluoromethane sulfonic acid (p-tert-butoxy phenyl) diphenyl sulfonium, trifluoromethane sulfonic acid bis (p-tert-butoxy phenyl) phenyl sulfonium, trifluoromethane sulfonic-acid tris (p-tert-butoxy phenyl) sulfonium, p-toluenesulfonic acid triphenyl sulfonium, p-toluenesulfonic acid (p-tert-butoxy phenyl) diphenyl sulfonium, p-toluenesulfonic acid bis(p-tert-butoxy phenyl) phenyl sulfonium, p-toluenesulfonic-acid tris (p-tert-butoxy phenyl) sulfonium, nonafluoro butane sulfonic acid triphenyl sulfonium, butane sulfonic-acid triphenyl sulfonium, trifluoromethane sulfonic-acid trimethyl sulfonium, p-toluenesulfonic-acid trimethyl sulfonium, trifluoromethane sulfonic-acid cyclohexyl methyl (2-oxocyclohexyl) sulfonium, p-toluenesulfonic acid cyclohexyl methyl (2-oxo cyclohexyl) sulfonium, trifluoromethane sulfonic acid dimethyl phenyl sulfonium, p-toluenesulfonic acid dimethyl phenyl sulfonium, trifluoromethane sulfonic acid dicyclohexyl phenyl sulfonium, p-toluenesulfonic acid dicyclohexyl phenyl sulfonium, trifluoromethane sulfonic acid trinaphthylsulfonium, trifluoromethane sulfonic acid (2-norbonyl) methyl (2-oxocyclohexyl) sulfonium, ethylene bis [methyl (2-oxocyclopentyl) sulfonium trifluoromethane sulfonate], 1,2'-naphthyl carbonyl methyl-tetrahydro thiophenium triflate.

Examples of a diazomethane derivative may include: bis(benzene sulfonyl) diazomethane, bis(p-toluene sulfonyl) diazomethane, bis(xylene sulfonyl) diazomethane, bis(cyclohexyl sulfonyl) diazomethane, bis(cyclopentyl sulfonyl) diazomethane, bis(n-butylsulfonyl) diazomethane, bis (isobutyl sulfonyl) diazomethane, bis(sec-butylsulfonyl) diazomethane, bis(n-propylsulfonyl) diazomethane, bis(isopropyl sulfonyl) diazomethane, bis(tert-butyl-sulfonyl) diazomethane, bis(n-amylsulfonyl) diazomethane, bis(isoamylsulfonyl) diazomethane, bis(sec-amylsulfonyl) diazomethane, bis(tert-amylsulfonyl) diazomethane, 1-cyclohexylsulfonyl-1-(tert-butyl-sulfonyl) diazomethane, 1-cyclohexyl sulfonyl-1-(tert-amyl sulfonyl) diazomethane, 1-tert-amyl sulfonyl-1-(tert-butyl-sulfonyl) diazomethane and the like.

Examples of a glyoxime derivative may include: bis-O-(p-toluene sulfonyl)-α-dimethylglyoxime, bis-O-(p-toluene sulfonyl)-α-diphenyl glyoxime, bis-O-(p-toluene sulfonyl)-α-dicyclohexyl glyoxime, bis-O-(p-toluene sulfonyl)-2,3-pentanedione glyoxime, bis-O-(p-toluene sulfonyl)-2-methyl-3,4-pentanedione glyoxime, bis-O-(n-butane sulfonyl)-α-dimethylglyoxime, bis-O-(n-butane sulfonyl)-α-diphenyl glyoxime, bis-O-(n-butane sulfonyl)-α-dicyclohexyl glyoxime, bis-O-(n-butane sulfonyl)-2,3-pentanedione glyoxime, bis-O-(n-butane sulfonyl)-2-methyl-3,4-pentanedione glyoxime, bis-O-(methane sulfonyl)-α-dimethylglyoxime, bis-O-(trifluoromethane sulfonyl)-α-dimethylglyoxime, bis-O-(1,1,1-trifluoro ethane sulfonyl)-α-dimethylglyoxime, bis-O-(tert-butane sulfonyl)-α-dimethylglyoxime, bis-O-(perfluoro octane sulfonyl)-α-dimethylglyoxime, bis-O-(cyclohexane sulfonyl)-α-dimethylglyoxime, bis-O-(benzene sulfonyl)-α-dimethylglyoxime, bis-O-(p-fluorobenzene sulfonyl)-α-dimethylglyoxime, bis-O-(p-tert-butylbenzene sulfonyl)-α-dimethylglyoxime, bis-O-(xylene sulfonyl)-α-dimethylglyoxime, bis-O-(camphor sulfonyl)-α-dimethylglyoxime and the like.

Examples of a bissulfone derivative may include: bis naphthyl sulfonyl methane, bis-trifluoro methyl sulfonyl methane, bis methyl sulfonyl methane, bis ethyl sulfonyl methane, bis propyl sulfonyl methane, bis isopropyl sulfonyl methane, bis-p-toluene sulfonyl methane, bis benzene sulfonyl methane and the like.

Examples of the β-ketosulfone derivative may include: 2-cyclohexyl carbonyl-2-(p-toluene sulfonyl) propane, 2-isopropyl carbonyl-2-(p-toluene sulfonyl) propane and the like.

Examples of the disulfone derivative may include: diphenyl disulfone derivative, a diyclohexyl disulfone derivative and the like.

Examples of the nitro benzyl sulfonate derivative may include: p-toluenesulfonic acid 2,6-dinitro benzyl, p-toluenesulfonic acid 2,4-dinitro benzyl, and the like.

Examples of the sulfonate derivative may include: 1,2,3-tris(methane sulfonyloxy) benzene, 1,2,3-tris(trifluoromethane sulfonyloxy) benzene, 1,2,3-tris(p-toluene sulfonyloxy) benzene and the like.

Examples of the sulfonate derivative of N-hydroxy imide compound may include: N-hydroxy succinimide methane sulfonate, N-hydroxy succinimide trifluoromethane sulfonate, N-hydroxy succinimide ethane sulfonate, N-hydroxy succinimide 1-propane sulfonate, N-hydroxy succinimide 2-propane sulfonate, N-hydroxy succinimide 1-pentane sulfonate, N-hydroxy succinimide 1-octane sulfonate, N-hydroxy succinimide p-toluenesulfonic-acid ester, N-hydroxy succinimide p-methoxybenzene sulfonate, N-hydroxy succinimide 2-chloroethane sulfonate, N-hydroxy succinimide benzenesulfonic-acid ester, N-hydroxy succinimide-2,4,6-trimethyl benzene sulfonate, N-hydroxy succinimide 1-naphthalene sulfonate, N-hydroxy succinimide 2-naphthalene sulfonate, N-hydroxy-2-phenyl succinimide methane sulfonate, N-hydroxy maleimide methane sulfonate, N-hydroxy maleimide ethane sulfonate, N-hydroxy-2-phenyl maleimide methane sulfonate, N-hydroxy glutarimide methane sulfonate, N-hydroxy glutarimide benzenesulfonic-acid ester, N-hydroxy phthalimide methane sulfonate, N-hydroxy phthalimide benzenesulfonic-acid ester, N-hydroxy phthalimide trifluoromethane sulfonate, N-hydroxy phthalimide p-toluenesulfonic-acid ester, N-hydroxy naphthalimide methane sulfonate, N-hydroxy naphthalimide benzenesulfonic-acid ester, N-hydroxy-5-norbornene-2,3-dicarboxyimido methane sulfonate, N-hydroxy-5-norbornene-2,3-dicarboxyimido trifluoromethane sulfonate, N-hydroxy-5-norbornene-2,3-dicarboxyimido p-toluenesulfonate and the like.

Preferable examples thereof may include: an onium salt such as trifluoromethane sulfonic-acid triphenyl sulfonium, trifluoromethane sulfonic-acid (p-tert-butoxy phenyl) diphenyl sulfonium, trifluoromethane sulfonic-acid tris(p-tert-butoxy phenyl) sulfonium, p-toluenesulfonic-acid triphenyl sulfonium, p-toluenesulfonic-acid (p-tert-butoxy phenyl) diphenyl sulfonium, p-toluenesulfonic-acid tris (p-tert-butoxy phenyl) sulfonium, trifluoromethane sulfonic-acid trinaphthylsulfonium, trifluoromethane sulfonic-acid cyclohexyl methyl (2-oxocyclohexyl) sulfonium, trifluoromethane sulfonic-acid (2-norbonyl)methyl (2-oxocyclohexyl) sulfonium, 1,2'-naphthyl carbonylmethyl tetrahydrothiophenium triflate, and the like;

a diazomethane derivative such as bis(benzene sulfonyl) diazomethane, bis(p-toluene sulfonyl) diazomethane, bis (cyclohexyl sulfonyl) diazomethane, bis(n-butylsulfonyl) diazomethane, bis(isobutyl sulfonyl) diazomethane, bis(sec-butylsulfonyl) diazomethane, bis(n-propyl sulfonyl) diazomethane, bis(isopropyl sulfonyl) diazomethane, bis(tert-butylsulfonyl) diazomethane and the like;

a glyoxime derivative, such as bis-O-(p-toluene sulfonyl)-α-dimethylglyoxime, bis-O-(n-butane sulfonyl)-α-dimethylglyoxime and the like;

a bissulfone derivative, such as bisnaphthyl sulfonyl methane;

a sulfonate derivative of N-hydroxyimide compounds, such as N-hydroxy succinimide methane sulfonate, N-hydroxy succinimide trifluoromethane sulfonate, N-hydroxy succinimide 1-propane sulfonate, N-hydroxy succinimide 2-propane sulfonate, N-hydroxy succinimide 1-pentane sulfonate, N-hydroxy succinimide p-toluene sulfonate, N-hydroxy naphthalimide methane sulfonate and N-hydroxy naphthalimide benzene sulfonate.

The above-mentioned acid generating agent may be used alone or in a combination of two or more kinds of them.

An amount of the acid generating agent to be added is preferably 0.1 to 50 parts, more preferably 0.5 to 40 parts to 100 parts of a base polymer. If it is fewer than 0.1 parts, a crosslinking reaction may be insufficient sometimes. If it exceeds 50 parts, there may be caused sometimes a mixing phenomenon due to migration of an acid to the upper resist film.

Furthermore, a basic compound for improving preservation stability can be blended with the resist lower layer film material of the present invention.

A compound which plays a role of a quencher to an acid to prevent an acid generated in a minute amount by an acid generating agent from promoting a crosslinking reaction is suitable as the basic compound.

Examples of such a basic compound may include: a primary, secondary and tertiary aliphatic amines, a mixed amine, an aromatic amine, a heterocyclic amine, a compound containing nitrogen which has a carboxy group, a compound containing nitrogen which has a sulfonyl group, a compound containing nitrogen which has a hydroxyl group, a compound containing nitrogen which has a hydroxy phenyl group, an alcoholic compound containing nitrogen, an amide derivative, an imido derivative and the like.

Specific examples of the primary aliphatic amine may include: ammonia, methylamine, ethylamine, n-propylamine, isopropylamine, n-butylamine, isobutyl amine, sec-butyl-amine, tert-butylamine, pentylamine, tert-amylamine, cyclopentyl amine, hexylamine, cyclohexyl amine, heptylamine, octylamine, nonylamine, decyl amine, dodecylamine, cetylamine, methylene diamine, ethylenediamine, tetraethylene pentamine and the like. Examples of the secondry aliphatic amine may include: dimethylamine, diethylamine, di-n-propylamine, diisopropyl amine, di-n-butylamine, diisobutyl amine, di-sec-butylamine, dipentylamine, dicyclopentyl amine, dihexyl amine, dicyclohexyl amine, diheptylamine, dioctylamine, dinonylamine, didecylamine, didodecylamine, dicetylamine, N,N-dimethyl methylenediamine, N,N-dimethyl ethylenediamine, N,N-dimethyl tetraethylene pentamine and the like. Examples of the tertiary aliphatic amine may include: trimethylamine, triethylamine, tri-n-propylamine, triisopropyl amine, tri-n-butyl amine, triisobutyl amine, tri-sec-butyl amine, tripentyl amine, tricyclopentyl amine, trihexyl amine, tricyclohexyl amine, triheptyl amine, trioctyl amine, trinonyl amine, tridecyl amine, tridodecyl amine, tricetyl amine, N,N,N',N'-tetra methyl methylene diamine, N,N,N',N'-tetramethyl ethylenediamine, N,N,N',N'-tetramethyl tetraethylene pentamine and the like.

Moreover, examples of the mixed amines may include: a-dicyclohexyl dimethyl ethylamine, methyl ethyl propyl amine, benzylamine, phenethyl amine, benzyl dimethylamine, and the like.

Examples of the aromatic amines and the heterocyclic amines may include: an aniline derivative (for example, aniline, N-methyl aniline, N-ethyl aniline, N-propyl aniline, N,N-dimethylaniline, 2-methyl aniline, 3-methyl aniline, 4-methyl aniline, ethyl aniline, propyl aniline, trimethyl aniline, 2-nitroaniline, 3-nitroaniline, 4-nitroaniline, 2,4-dinitro aniline, 2,6-dinitro aniline, 3,5-dinitro aniline, N,N-dimethyl toluidine and the like), diphenyl (p-tolyl) amine, methyl diphenylamine, triphenylamine, phenylenediamine, naphthylamine, diamino naphthalene, a pyrrole derivative (for example, pyrrole, 2H-pyrrole, 1-methyl pyrrole, 2,4-dimethyl pyrrole, 2,5-dimethyl pyrrole, N-methyl pyrrole, and the like), an oxazole derivative (for example, oxazole, isoxazole and the like), a thiazole derivative (for example, thiazole, isothiazole, and the like), an imidazole derivative (for example, imidazole, 4-methyl imidazole, 4-methyl-2-phenyl imidazole and the like), a pyrazole derivative, a furazan derivative, a pyrroline derivative (for example, pyrroline, 2-methyl-1-pyrroline and the like), a pyrrolidine derivative (for example, pyrrolidine, N-methyl pyrrolidine, pyrrolidinone, N-methyl pyrolidone and the like), an imidazoline derivative, an imidazolidine derivative, a pyridine derivative (for example, pyridine, methyl pyridine, ethyl pyridine, propyl pyridine, butyl pyridine, 4-(1-butyl pentyl) pyridine, dimethyl pyridine, trimethyl pyridine, triethyl pyridine, phenyl pyridine, 3-methyl-2-phenyl pyridine, 4-tert-butyl pyridine, diphenyl pyridine, benzyl pyridine, methoxy pyridine, butoxy pyridine, dimethoxy pyridine, 1-methyl-2-pyridone, 4-pyrrolidino pyridine, 1-methyl-4-phenyl pyridine, 2-(1-ethylpropyl) pyridine, amino pyridine, dimethyl amino pyridine and the like), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinoline carbonitrile, and the like), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, 1,10-phenanthroline derivative, an adenine derivative, an adenosine derivative, a guanine derivative, a guanosine derivative, an uracil derivative, a uridine derivative and the like.

Furthermore, examples of a compound containing nitrogen which has a carboxy group may include: aminobenzoic acid, indole carboxylic acid, and an amino acid derivative (for example, nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, methoxy alanine) and the like. Examples of a compound containing nitrogen which has a sulfonyl group may include: 3-pyridine sulfonic acid, p-toluenesulfonic acid pyridinium and the like. Examples of a compound containing nitrogen which has a hydroxyl group, a compound containing nitrogen which has a hydroxy phenyl group, and an alcoholic compound containing nitrogen may include: 2-hydroxy pyridine, amino cresol, 2,4-quinoline diol, 3-indole methanol hydrate, monoethanolamine, diethanolamine, triethanolamine, N-ethyl diethanolamine, N,N-diethyl ethanolamine, triisopropanol amine, 2,2'-iminodiethanol, 2-amino ethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxy ethyl)pyrrolidine, 1-(2-hydroxyethyl)-2-pyrrolidinone, 3-piperidinone-1,2-propanediol, 3-pyrrolidino-1,2-propanediol, 8-hydroxy julolidine, 3-quinuclidinol, 3-tropanol, 1-methyl-2-pyrrolidine ethanol, 1-aziridine ethanol, N-(2-hydroxyethyl) phthalimide, N-(2-hydroxyethyl) isonicotinamide, and the like.

Examples of an amide derivative may include: formamide, N-methyl formamide, N,N-dimethylformamide, acetamide, N-methyl acetamide, N,N-dimethylacetamide, propione amide, benzamide, and the like.

Examples of an imido derivative may include: phthalimide, succinimide, and maleimide, or the like.

An amount of the basic compound to be blended is preferably 0.001 to 2 parts, especially 0.01 to 1 parts to 100 parts of a total base polymer. If the amount is fewer than 0.001 parts, an effect of the blending is small. If it exceeds 2 parts, all the acids generated with heat may be trapped, and a crosslink may not be formed in some cases.

An organic solvent which can be used in the resist lower layer film material of the present invention is not limited, as far as the polymer represented by the above-mentioned general formula (1), an acid generating agent, a cross linking agent, other additives and the like can be dissolved. Specific examples thereof may include: ketones such as cyclohexanone, methyl-2-amyl ketone and the like; alcohols such as 3-methoxy butanol, 3-methyl-3-methoxy butanol, 1-methoxy-2-propanol, 1-ethoxy-2-propanol and the like; ethers such as propylene glycol monomethyl ether, ethylene glycol monomethyl ether, propylene-glycol monoethyl ether, ethylene glycol monoethyl ether, propylene-glycol dimethyl ether, diethylene-glycol dimethyl ether and the like; esters such as propylene-glycol-monomethyl-ether acetate, propylene-glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene-glycol-monomethyl-ether acetate, propylene-glycol mono-tert-butyl-ether acetate, and the like. They can be used alone or as a mixture of two or more of them. However, they are not limitative.

Among the above-mentioned organic solvents, diethylene-glycol dimethyl ether, 1-ethoxy-2-propanol, ethyl lactate, propylene-glycol-monomethyl-ether acetate, and a mixed solvent thereof are preferably used in the resist lower layer film material of the present invention.

The amount of the organic solvent to be blended is preferably 200 to 10,000 parts, especially 300 to 5,000 parts to 100 parts of the total base polymer.

Furthermore, the method of the present invention is a method of forming a pattern on a substrate by lithography wherein, at least, a resist lower layer film is formed on a substrate using the resist lower layer film material of the present invention, one or more layers of the resist upper layer film of a photoresist composition are formed on this lower layer film, to form a multilayer-resist film, a pattern circuit area of this multilayer-resist film is exposed and developed with a developer to form a resist pattern on the resist upper layer film, the resist lower layer film is etched using as a mask the resist upper layer film on which the pattern is formed, and then the substrate is etched using as a mask the multilayer-resist film on which the pattern is formed, to form a pattern on the substrate.

The method for forming a pattern according to the present invention will be explained with reference to FIG. 4.

First, a resist lower layer film 12 can be formed on a substrate 11 by a spin coat method or the like as in the usual method of forming a photoresist film. After forming the resist lower layer film 12 by the spin coat method or the like, it is preferable that an organic solvent is evaporated, and baking is performed in order to promote a crosslinking reaction and to prevent intermixing with a resist upper layer film 13. The baking is preferably carried out at a temperature in the range of 80–300° C., for 10–300 seconds. Although a thickness of the resist lower layer film 12 is selected appropriately, it is preferably 100–20,000 nm, and is especially 150–15,000 nm. After forming the resist lower layer film 12, the resist upper layer film 13 is formed on it (see FIG. 4(a)).

In this case, a known photoresist composition can be used to form the resist upper layer film 13. From the point of resistance to an oxygen gas etching, there can be used a positive type photoresist composition or the like wherein a silicon atom containing polymer such as a polysilsesquioxane derivative or a vinyl silane derivative, is used as a base polymer, and an organic solvent and an acid generating agent, and if necessary a basic compound or the like are contained.

In addition, it is desirable to use those containing a silicon atom as the resist upper layer film 13, and a well-known polymer used for this kind of resist composition can be used as the silicon atom containing polymer.

When forming the resist upper layer film 13 with the above-mentioned photoresist composition, the spin coat method or the like is preferably used as in the case where the above-mentioned resist lower layer film is formed. Although pre-baking is performed after formation of the resist upper layer film 13 by the spin coat method or the like, it is desirable to be performed at a temperature of 80–180° C. for 10–300 seconds.

Then, according to a conventional method, a pattern circuit area of the multilayer-resist film is exposed, and post exposure baking (PEB) and development are performed, to obtain a resist pattern (see FIG. 4(b)).

Although a thickness of the resist upper layer film 13 is not restricted, it is preferably 30–500 nm, especially 50–400 nm.

The development is performed by a paddle method, a dipping method, or the like using an alkali solution. Preferably, the paddle method using a 2.38% by weight aqueous solution of tetramethyl ammonium hydroxide is used, and it is performed at a room temperature for 10 seconds–300 seconds. Then, it is rinsed with pure water, and is dried by a spin dry or a nitrogen blow or the like.

Then, etching of the resist lower layer film 12 is performed using the resist upper layer film 13 on which a resist pattern is formed as a mask by dry etching with a gas mainly containing oxygen gas or the like (see FIG. 4(c)). This etching can be performed by a conventional method. In the case of the dry etching with a gas mainly containing oxygen gas, it is also possible to add an inert gases such as He, Ar and the like, and CO, $CO_2$, $NH_3$, $SO_2$, $N_2$, and $NO_2$ gas in addition to oxygen gas. Especially the latter gas is used for protection of a side wall to prevent undercut of a side wall of a pattern.

The following etching of the substrate 11 can also be performed by a conventional method. For example, etching with a gas mainly containing a chlorofluocarbon gas is conducted in the case that the substrate is $SiO_2$ or SiN. Etching with a gas mainly containing a chlorine gas or a bromine gas is conducted in the case that the substrate is poly silicon (p-Si), Al or W (see FIG. 4(d)). The resist lower layer film of the present invention has a feature that an etching resistance is excellent at the time of the etching of the substrate. At this time, etching of a substrate may be conducted after removing the resist upper layer film, if needed. Alternatively, etching of the substrate may be conducted with leaving the resist upper layer film.

Figure 4:
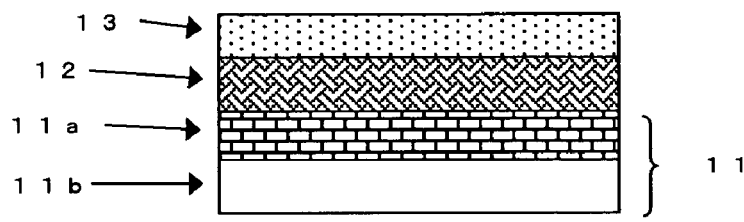
FIG. 4 is an explanatory view of one method for forming a pattern of the present invention. (a) shows the state before forming the pattern. (b) shows formation of the resist pattern on the resist upper layer film. (c) shows the pattern transfer to the resist lower layer film. (d) shows formation of the pattern on the substrate.
Figure 4:
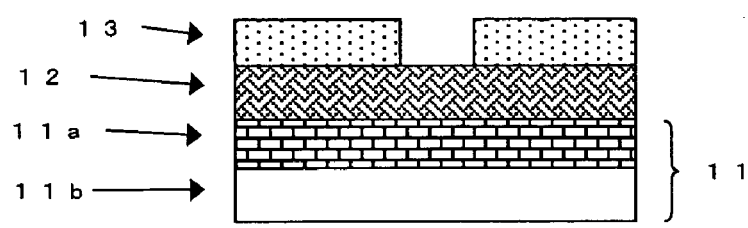
Figure 4:
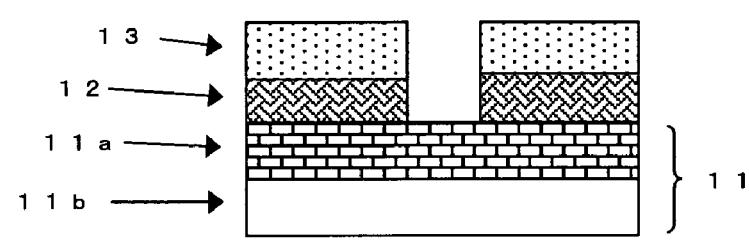
Figure 4:
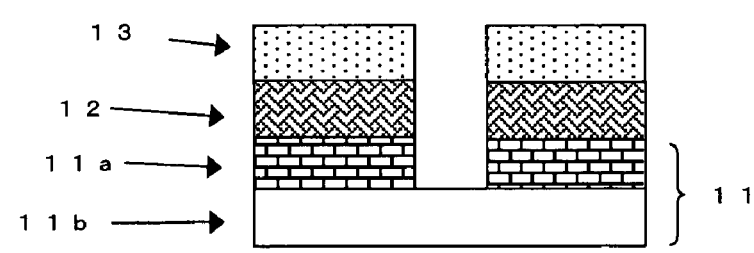

In addition, as shown in FIG. 4, the substrate 11 may consist of a processed layer 11a and a base layer 11b. The base layer 11b of the substrate 11 is not limited and may be Si, an amorphous silicon (α-Si), p-Si, $SiO_2$, SiN, SiON, W, TiN, aluminum, or the like. A material having a different quality from a processed layer 11a may be used. As the processed layer 11a, Si, $SiO_2$, SiON, SiN, p-Si, α-Si, W, W–Si, Al, Cu, Al–Si, or the like, or various low dielectric films, and an etching stopper film of them may be used, and it may be formed generally at a thickness of 50–10,000 nm, especially at a thickness of 100–5,000 nm.

EXAMPLES

The present invention will be explained with referring to Synthesis Examples, Comparative Synthesis Examples, Examples and Comparative Examples. However, the present invention is not limited to them.

Synthesis Example 1

94 g (one mol) of phenol and 0.01 g of trifluoromethane sulfonic acid were added to a 300 mL flask, and 40 g (0.3 mol) of dicyclopentadiene was dropped over 1 hour, with stirring at 50° C. After stirring at this temperature for 1 hour, the temperature was raised to 150° C., and stirring was continued for 2 hours to complete the reaction. An unreacted substance was removed by distillation at a reduced pressure. A reaction product was dissolved in 200 g of 1,2-dichloroethane, then a catalyst and a metal impurity were removed by washing with water, and 1,2-dichloroethane was removed at a reduced pressure, to yield 118 g of the following polymer 1.

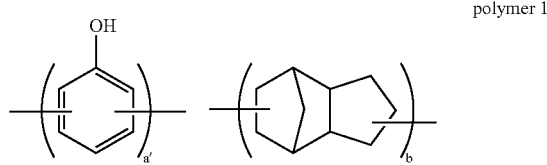

polymer 1

The molecular weight (Mw) as converted to polystyrene and a degree of dispersion (Mw/Mn) were determined by gel permeation chromatography (GPC), and a mole-ratio of phenol (a') and dicyclopentadiene (b) in polymer 1 was determined as follows by $^1$H-NMR analysis.

Mole-ratio a':b=0.68:0.32 Molecular-weight (Mw)=3,400 Degree of dispersion (Mw/Mn)=3.8

Synthesis Example 2

115 g of the polymer 1 (phenol-dicyclopentadiene resin) obtained in Synthesis Example 1, and 140 g of 1-adamantane methanol were dissolved in THF (tetrahydrofuran) in 300 mL flask. Then, 0.1 g of tosyl acid was added thereto, and stirred at 80° C., for 24 hours. The catalyst and metal impurities were removed by washing with water, and then THF was removed at a reduced pressure, to yield 193 g of the following polymer 2.

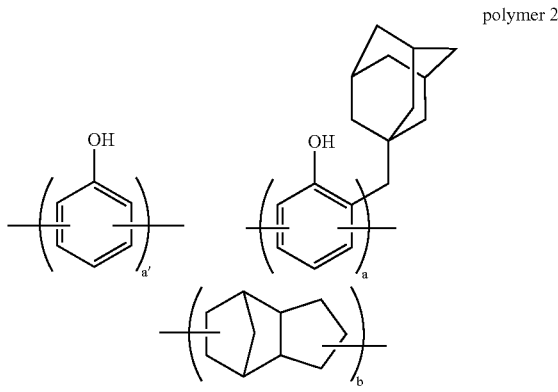

polymer 2

The molecular weight (Mw) and a degree of dispersion (Mw/Mn) were determined by GPC, and a mole-ratio of phenol (a') and adamantane methanol pendant phenol (a) and dicyclopentadiene (b) in the polymer 2 was determined as follows by $^1$H-NMR analysis.

Mole-ratio a':a:b=0.13:0.55:0.32 molecular-weight (Mw)=5,400 degree of dispersion (Mw/Mn)=3.9

Synthesis Example 3

115 g of the polymer 1 (phenol-dicyclopentadiene resin) obtained in Synthesis Example 1, and 155 g of 1-naphthalene methanol were dissolved in THF in 300 mL flask. Then, 0.1 g of tosyl acid was added thereto, and stirred at 80° C., for 24 hours. The catalyst and metal impurities were removed by washing with water, and then THF was removed at a reduced pressure, to yield 233 g of the following polymer 3.

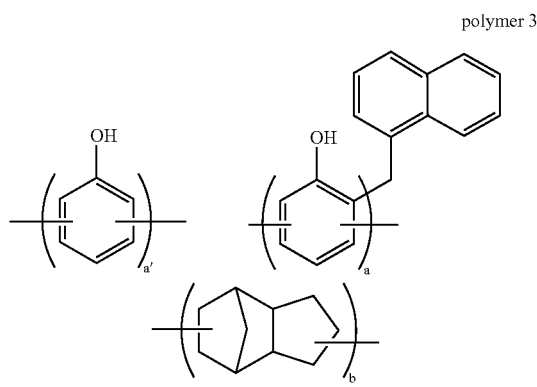

polymer 3

The molecular weight (Mw) and a degree of dispersion (Mw/Mn) were determined by GPC, and a mole-ratio of phenol (a') and naphthalene methanol pendant phenol (a) and dicyclopentadiene (b) in the polymer 3 was determined as follows by $^1$H-NMR analysis.

Mole-ratio a':a:b=0.08:0.60:0.32 Molecular weight (Mw)=5,900 Degree of dispersion (Mw/Mn)=3.9

Synthesis Example 4

115 g of the polymer 1 (phenol-dicyclopentadiene resin) obtained in Synthesis Example 1, and 103 g of 1-norbornane methanol were dissolved in THF in 300 mL flask. Then, 0.1 g of tosyl acid was added thereto, and stirred at 80° C., for 24 hours. The catalyst and metal impurities were removed by washing with water, and then THF was removed at a reduced pressure, to yield 188 g of the following polymer 4.

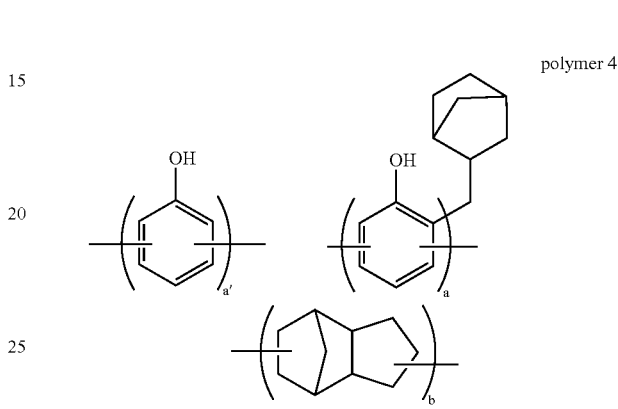

polymer 4

The molecular weight (Mw) and a degree of dispersion (Mw/Mn) were determined by GPC, and a mole-ratio of phenol (a') and norobornane methanol pendant phenol (a) and dicyclopentadiene (b) in the polymer 4 was determined as follows by $^1$H-NMR analysis.

Mole-ratio a':a:b=0.08:0.60:0.32 Molecular weight (Mw)=4,700 Degree of dispersion (Mw/Mn)=3.7

Comparative Synthesis Example 1 m-cresol novolak resin was synthesized and it used as comparative polymer 1. The result of analysis of this polymer is shown below.

Molecular weight (Mw)=8,900 Degree of dispersion (Mw/Mn)=4.8

Comparative Synthesis Example 2

1-naphthol novolak resin was synthesized and used as comparative polymer 2.

The result of analysis of this polymer is shown below.

Molecular-weight (Mw)=3,300 Degree of dispersion (Mw/Mn)=3.5

Comparative Synthesis Example 3

The polymer consisting of p-hydroxy styrene and hydroxy ethyl acrylate was synthesized and used as comparative polymer 3.

The result of analysis of this polymer is shown below.

Mole-ratio of p-hydroxy styrene: hydroxy ethyl acrylate=0.3:0.7 Molecular-weight (Mw)=33,000 Degree of dispersion (Mw/Mn) =1.9

Examples, Comparative Examples

[Preparation of the Resist Lower Layer Film Material]

The solutions of the resist lower layer film material (Examples 1–5, and Comparative Examples 1–3) were prepared by dissolving the polymers of the above-mentioned Synthesis Examples 2–4 and Comparative examples 1–3, an acid generating agent shown as AG 1 and 2 and a crosslinking agent shown by CR 1 and 2 at a rate shown in Table 1 in an organic solvent containing 0.1% by weight of FC-430 (manufactured by Sumitomo 3M), and filtering them with a 0.1 μm filter made of a fluororesin, respectively.

Each of the compositions in Table 1 is as follows.
Polymer 2–polymer 4: from Synthesis Example 2-Synthesis Example 4
Comparative polymer 1–3: from Comparative Example 1–Comparative Example 3
Acid generating agent: AG1 and AG2 (see the following structural formulae)

Crosslinking agent: CR1, CR2 (see the following structural formulae)

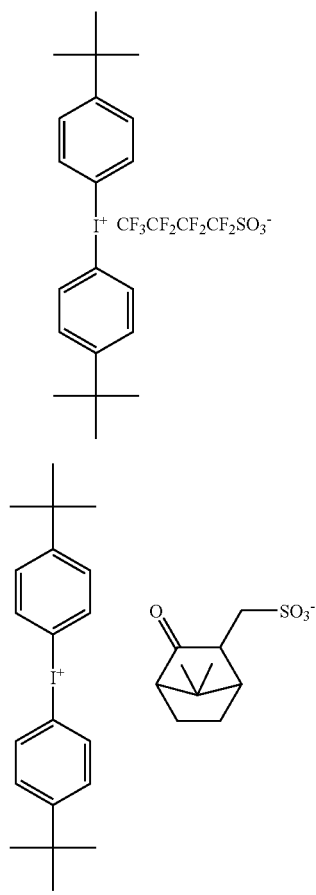

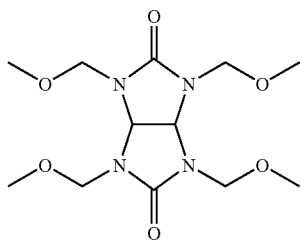

CR1

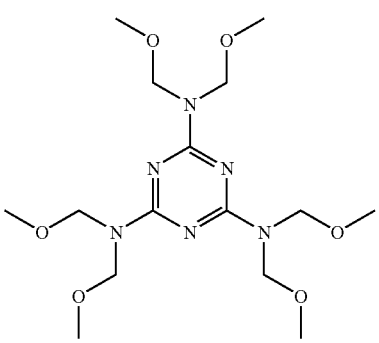

CR2

Organic solvent: PGMEA (propylene glycol monomethyl ether acetate)

The solutions of the resist lower layer film material (Examples 1–5, Comparative examples 1–3) prepared as described above were applied on the silicon substrate, and baked for 60 seconds at 200° C., to form the resist lower layer film having a thickness of 400 nm.

After formation of the resist lower layer film, the refraction index n and extinction coefficient k of the resist lower layer film at a wavelength of 193 nm was measured using an incident light angle variable spectrum elipsometer (VASE) manufactured by J. A. Uhram corporation. The results were shown in Table 1.

TABLE 1

| | Polymer (Parts by weight) | Crosslinking Agent (Parts by weight) | Acid generating agent (Parts by weight) | Organic solvent (Parts by weight) | Refraction index at wavelength of 193 nm | |
|---|---|---|---|---|---|---|
| | | | | | n value | k value |
| Example 1 | Polymer 2 (28.0) | CR1 (10) | AG1 (5) | PGMEA (100) | 1.71 | 0.15 |
| Example 2 | Polymer 3 (28.0) | CR1 (10) | AG1 (5) | PGMEA (100) | 1.69 | 0.21 |
| Example 3 | Polymer 4 (10.0) | CR1 (10) | AG1 (5) | PGMEA (100) | 1.60 | 0.18 |

TABLE 1-continued

|  | Polymer (Parts by weight) | Crosslinking Agent (Parts by weight) | Acid generating agent (Parts by weight) | Organic solvent (Parts by weight) | Refraction index at wavelength of 193 nm | |
|---|---|---|---|---|---|---|
|  |  |  |  |  | n value | k value |
| Example 4 | Polymer 2 (28.0) | CR2 (10) | AG1 (5) | PGMEA (100) | 1.70 | 0.16 |
| Example 5 | Polymer 2 (28.0) | CR1 (10) | AG2 (5) | PGMEA (100) | 1.72 | 0.19 |
| Comparative Example 1 | Comparative polymer 1 (25.0) | CR1 (10) | AG1 (5) | PGMEA (100) | 1.32 | 0.62 |
| Comparative Example 2 | Comparative polymer 2 (28.0) | CR1 (10) | AG1 (5) | PGMEA (100) | 1.40 | 0.33 |
| Comparative Example 3 | Comparative polymer 3 (22.0) | CR1 (10) | AG1 (5) | PGMEA (100) | 1.70 | 0.25 |

As shown in Table 1, in Examples 1–5, it was found that the n value which is an index of refraction of the resist lower layer film at a wavelength of 193 nm was in the ranges of 1.5–1.9, and the k value was in the range of 0.15–0.3, and especially the film having a thickness of 200 nm or more has the optimal refraction index n and the optimal extinction coefficient k which can achieve a sufficient reflective prevention effect.

[Preparation of the Resist Upper Layer Film Material]

The following polymers (ArF silicon containing polymer 1 and 2) were prepared as a base resin of the resist upper layer film.

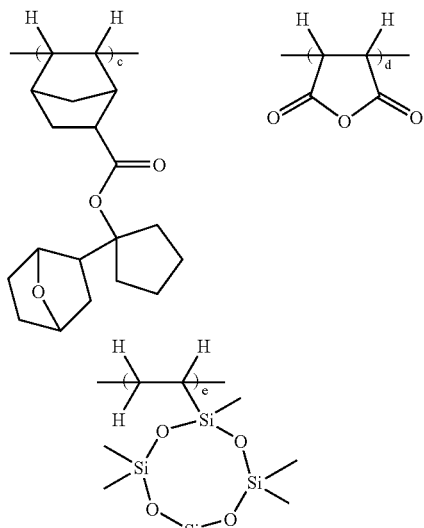

ArF silicon containing polymer 1

ArF silicon containing polymer 1 is a polymer which consists of the repeating units c, d and e shown above. A molar ratio and a molecular weight (Mw) of the polymer are shown below.

Molar ratio: c:d:e=0.4:0.5:0.1 Molecular weight (Mw)=8,800

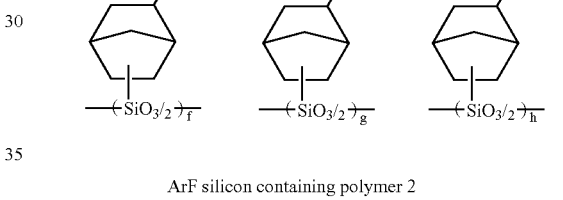

ArF silicon containing polymer 2

ArF silicon containing polymer 2 is a polymer which consists of the repeating units f, g and h shown above. A molar ratio and a molecular weight (Mw) of this polymer are shown below.

Copolymerization ratio: f:g:h=0.2:0.6:0.2 Weight average molecular weight (Mw)=2,500

The solutions of the resist upper layer film materials 1 and 2 which consist of the polymer (ArF silicon containing polymers 1 and 2) prepared above, the acid generating agent PAG 1 and 2, the base additive AACN, and an organic solvent were prepared, respectively.

Each composition in Table 2 is as follows.

Acid generating agent: PAG1, PAG2 (see the following structural formula)

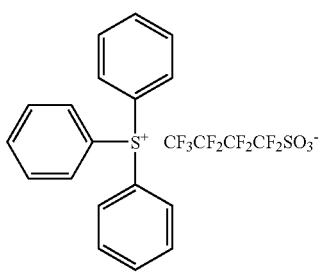

PAG1

-continued

PAG2

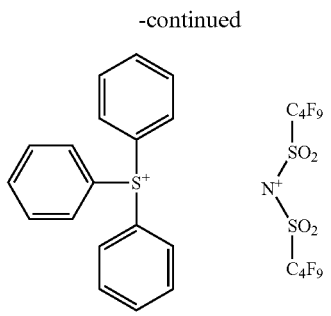

Base Additive: AACN (see the Following Structural Formula)

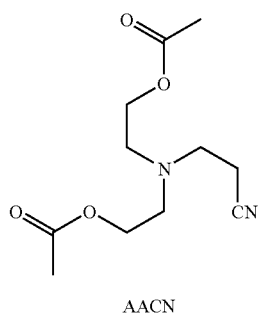

AACN

Organic Solvent: PGMEA (Propylene Glycol Monomethyl Ether Acetate)

TABLE 2

|  | Polymer (Parts by weight) | Acid generating agent (Parts by weight) | Base additive (Parts by weight) | Organic solvent (Parts by weight) |
|---|---|---|---|---|
| Resist upper Layer film material 1 | ArF silicon containing polymer 1 (100) | PAG1 (2.2) | AACN (0.3) | PGMEA (1,200) |
| Resist upper Layer film material 2 | ArF silicon containing polymer 2 (100) | PAG2 (2.2) | AACN (0.5) | PGMEA (800) |

[Observation of a Pattern Configuration, Etching Resistance Test]

(1) Observation of a Pattern Configuration

1) Observation of Resist Pattern Configuration

The solutions of the resist lower layer film materials (Examples 1–5, Comparative Examples 1–3) were applied on the substrate having $SiO_2$ with a thickness of 300 nm, and baked for 60 seconds at 200° C., to form the resist lower layer film with a thickness of 400 nm.

Next, the solutions of the resist upper layer film materials 1 and 2 prepared above were applied on the resist lower layer film in the combination shown in Table 3, and baked for 60 seconds at 110° C., and thereby the silicon containing resist upper layer film with a thickness of 200 nm was formed.

Subsequently, it was exposed by the ArF exposing apparatus (S305B, NA0.68, σ0.85, ⅔ ring lighting, Cr mask, manufactured by Nikon), baked (PEB) for 90 seconds at 110° C., and developed for 60 seconds in 2.38% by weight aqueous solution of tetra methyl ammonium hydroxide (TMAH), to provide a 0.10 μmL/S (line and space) positive resist pattern. The results of observation of the resist pattern configuration with an electron microscope manufactured by Hitachi Ltd. (SEM: S-4700) were shown in Table 3.

As a result, it was confirmed that when the resist lower layer film materials of Examples 1 to 5 and Comparative Example 3 were used, there were not caused footing profile, undercut, and intermixing phenomenon, but a rectangular pattern was obtained. However, when the resist lower layer film material of Comparative Example 1 was used, a pattern was fallen. When the resist lower layer film material of Comparative Example 2 was used, there were caused undercut, roughness of the side wall and the like near the resist lower layer film.

2) Observation of Cross-Sectional Configuration of the Resist lower Layer Film after Dry Etching with a Gas mainly containing oxygen gas Next, after the resist pattern was formed using the same material and method as those used in the above-mentioned observation of the resist pattern configuration, the resist lower layer film was etched by the dry etching with a gas mainly containing oxygen gas using as a mask the resist upper layer film on which the resist pattern was formed.

The etching conditions of the dry etching with a gas mainly containing oxygen gas were as follows.

Chamber pressure: 450 mTorr
RF power: 600 W
Ar gas flow amount: 40 sccm
$O_2$ gas flow amount: 60 sccm
Gap: 9 mm
Time: 20 sec The results of observation of the cross-sectional configuration of the etched resist lower layer film with an electron microscope manufactured by Hitachi Ltd.(SEM: S-4700) are shown in Table 3. Consequently, it was confirmed that the cross-sectional configuration of a resist lower layer film was a perpendicular configuration in the case that the resist lower layer film materials of Examples 1–5 and Comparative Example 3 were used. However, when the resist lower layer film material of Comparative Example 2 was used, it became a taper shape.

3) Observation of Cross-Sectional Configuration of the Resist lower Layer Film after Etching with $CHF_3/CF_4$ Gas Next, after etching the resist lower layer film using the same material and method as those used in the above-mentioned observation of cross-sectional configuration of the resist lower layer film after dry etching with a gas mainly containing oxygen gas, etching with $CHF_3/CF_4$ gas was carried out, to form a pattern on the $SiO_2$ substrate.

The etching conditions of etching with the CHF$_3$/CF$_4$ gas were shown below.
Chamber pressure: 40.0 Pa
RF power: 1,300 W
gap: 9 mm
CHF$_3$ gas flow amount: 30 ml/min
CF$_4$ gas flow amount: 30 ml/min
Ar gas flow amount: 100 ml/min
Time: 60 sec After formation of the pattern, a cross-sectional configuration of the resist lower layer film was observed with an electron microscope (SEM; S-4700) manufactured by Hitachi ltd., the configurations were compared, and the results were summarized in Table 3.

Consequently, the cross-sectional configuration of the resist lower layer film was a perpendicular configuration and good in the case that the resist lower layer film material of Examples 1–5 were used. However, it became a taper configuration, in the case that the resist lower layer film material of Comparative Examples 2,3 was used.

the resist lower layer film with a thickness of 300 nm was formed. They were evaluated under the two types of the following conditions.

1) Etching Test with CHF$_3$/CF$_4$ Gas

A difference in a thickness of the resist lower layer film before and after etching was measured using dry-etching-system TE-8500P manufactured by Tokyo Electron, Ltd.
Etching conditions were the same as above.
The results were shown in Table 4.

TABLE 4

| Resist lower layer film material | CHF$_3$/CF$_4$ gas etching rate (nm/min) |
| --- | --- |
| Example 1 | 85 |
| Example 2 | 82 |
| Example 3 | 98 |
| Example 4 | 88 |
| Example 5 | 84 |
| Comparative Example 1 | 98 |

TABLE 3

| Resist lower layer film material | Resist upper layer film material | Resist pattern configuration after development | Resist lower layer film cross sectional shape after Oxgen gas etching | Resist lower layer film cross sectional shape after CHF$_3$/CH$_4$ gas etching |
| --- | --- | --- | --- | --- |
| Example 1 | Resist upper layer film material 1 | Perpendicular shape | Perpendicular shape | Perpendicular shape |
| Example 2 | Resist upper layer film material 1 | Perpendicular shape | Perpendicular shape | Perpendicular shape |
| Example 3 | Resist upper layer film material 1 | Perpendicular shape | Perpendicular shape | Perpendicular shape |
| Example 4 | Resist upper layer film material 1 | Perpendicular shape | Perpendicular shape | Perpendicular shape |
| Example 5 | Resist upper layer film material 1 | Perpendicular shape | Perpendicular shape | Perpendicular shape |
| Example 1 | Resist upper layer film material 2 | Perpendicular shape | Perpendicular shape | Perpendicular shape |
| Comparative Example 1 | Resist upper layer film material 1 | Pattern fall | — | — |
| Comparative Example1 2 | Resist upper layer film material 1 | UndercutShape, roughness of sidewall due to stationary wave | Tapered shape | Tapered shape |
| Comparative Example1 3 | Resist upper layer film material 1 | Perpendicular Shape | Perpendicular Shape | Tapered shape and film reduction |

As shown in Table 3, it was confirmed that the resist pattern configurations after development and the cross-sectional configuration of the resist lower layer film after the dry etching with a gas mainly containing oxygen gas and after etching with the CHF$_3$/CF$_4$ gas for substrate processing were good and the pattern with a high aspect ratio could be formed in Examples 1–5.

(2) Evaluation of Dry Etching Resistance

In the test of dry etching resistance, the solutions of the resist lower layer film materials (Examples 1–5, Comparative Examples 1–3) prepared as described above were applied on the Si substrate having SiO$_2$ with a thickness of 300 nm, and baked for 60 seconds at 200° C., and thereby TABLE 4-continued

| Resist lower layer film material | CHF$_3$/CF$_4$ gas etching rate (nm/min) |
| --- | --- |
| Comparative Example1 2 | 95 |
| Comparative Example1 3 | 144 |

2) Etching Test with Cl$_2$/BCl$_3$ Gas

The difference in a thickness of the resist lower layer film before and after etching was determined using a dry etching apparatus L-507 D-L manufactured by Nichiden Aneruba Co.,Ltd.

Etching conditions are shown below.

| | |
|---|---|
| Chamber pressure | 40.0 Pa |
| RF power | 300 W |
| Gap | 9 mm |
| $Cl_2$ gas flow amount | 30 ml/min |
| $BCl_3$ gas flow amount | 30 ml/min |
| $CHF_3$ gas flow amount | 100 ml/min |
| $O_2$ gas flow amount | 2 ml/min |
| Time | 60 sec |

The results were shown in Table 5.

TABLE 5

| Resist lower layer film material | $Cl_2/BCl_3$ gas etching rate (nm/min) |
|---|---|
| Example 1 | 105 |
| Example 2 | 115 |
| Example 3 | 122 |
| Example 4 | 108 |
| Example 5 | 105 |
| Comparative Example 1 | 125 |
| Comparative Example1 2 | 118 |
| Comparative Example1 3 | 166 |

As shown in Tables 4 and 5, in Examples 1–5, an etching rate of $CHF_3/CF_4$ gas etching and $Cl_2/BCl_3$ gas etching was the same as or lower than the novolak resin of Comparative Example 1,2, and was lower than the hydroxy styrene/hydroxy ethyl acrylate copolymer of Comparative Example 3. Therefore, it was found that the resist lower layer film of Examples 1–5 had a sufficiently high etching resistance.

The present invention is not limited to the above-described embodiment. The above-described embodiment is a mere example, and those having the substantially same structure as that described in the appended claims and providing the similar action and effects are included in the scope of the present invention.

What is claimed is:

1. A resist lower layer film material for a multilayer-resist film used in lithography in which the lower layer film material comprises a polymer having at least a repeating unit represented by the following general formula (1),

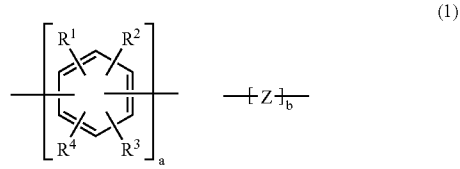

(1)

wherein $R^1$–$R^4$ independently represent any one of a hydrogen atom, a hydroxyl group, an alkyl group having 1–20 carbon atoms, an alkoxy group having 1–20 carbon atoms, an alkoxy carbonyl group having 1–20 carbon atoms, an acetoxy group, an aryl group having 6–10 carbon atoms, a hydroxy alkyl group having 1–6 carbon atoms, a hydroxy alkoxy group, an isocyanate group and a glycidyl ether group, or an organic group represented by the following general formula (2), and at least one of $R^1$–$R^4$ is the organic group represented by the following general formula (2),

(2)

wherein $R^5$ represents an alkylene group having 1–4 carbon atoms, and $R^6$ represents an alkyl group having 4–20 carbon atoms which has a cyclic structure, or an aryl group having 6–20 carbon atoms;

Z is a cycloaliphatic hydrocarbon group; and a and b are positive numbers.

2. The resist lower layer film material according to claim 1 wherein the resist lower layer film material further comprises any one or more of a cross linking agent, an acid generating agent, and an organic solvent.

3. A method for forming a pattern on a substrate by lithography wherein, at least, a resist lower layer film is formed on a substrate using the resist lower layer film material according to claim 1, one or more layers of a resist upper layer film of a photoresist composition are formed on the lower layer film, to form a multilayer-resist film, a pattern circuit area of the multilayer-resist film is exposed and developed with a developer to form a resist pattern on the resist upper layer film, the resist lower layer film is etched using as a mask the resist upper layer film on which the pattern is formed, and then the substrate is etched using as a mask the multilayer-resist film on which the pattern is formed, to form a pattern on the substrate.

4. A method for forming a pattern on a substrate by lithography wherein, at least, a resist lower layer film is formed on a substrate using the resist lower layer film material according to claim 2, one or more layers of a resist upper layer film of a photoresist composition are formed on the lower layer film, to form a multilayer-resist film, a pattern circuit area of the multilayer-resist film is exposed and developed with a developer to form a resist pattern on the resist upper layer film, the resist lower layer film is etched using as a mask the resist upper layer film on which the pattern is formed, and then the substrate is etched using as a mask the multilayer-resist film on which the pattern is formed, to form a pattern on the substrate.

5. The method for forming a pattern according to claim 3 wherein the resist upper layer film containing a silicon atom is used, and etching of the lower layer film using as a mask the resist upper layer film is performed by dry etching using a gas mainly containing oxygen gas.

6. The method for forming a pattern according to claim 4 wherein the resist upper layer film containing a silicon atom is used, and etching of the lower layer film using as a mask the resist upper layer film is performed by dry etching using a gas mainly containing oxygen gas.

7. The method for forming a pattern according to claim 3 wherein etching of the substrate using as a mask the multilayer-resist film on which the pattern is formed is performed by dry etching using a gas mainly containing any one of chlorofluocarbon gas, chlorine gas and bromine gas.

8. The method for forming a pattern according to claim 4 wherein etching of the substrate using as a mask the multilayer-resist film on which the pattern is formed is performed by dry etching using a gas mainly containing any one of chlorofluocarbon gas, chlorine gas and bromine gas.

9. The method for forming a pattern according to claim 5 wherein etching of the substrate using as a mask the multilayer-resist film on which the pattern is formed is performed by dry etching using a gas mainly containing any one of chlorofluocarbon gas, chlorine gas and bromine gas.

10. The method for forming a pattern according to claim 6 wherein etching of the substrate using as a mask the multilayer-resist film on which the pattern is formed is performed by dry etching using a gas mainly containing any one of chlorofluocarbon gas, chlorine gas and bromine gas.

* * * * *